United States Patent
Vaganov et al.

(10) Patent No.: US 9,034,666 B2
(45) Date of Patent: May 19, 2015

(54) METHOD OF TESTING OF MEMS DEVICES ON A WAFER LEVEL

(76) Inventors: Vladimir Vaganov, Los Gatos, CA (US); Nickolai Belov, Los Gatos, CA (US)

( * ) Notice: Subject to any disclaimer, the term of this patent is extended or adjusted under 35 U.S.C. 154(b) by 754 days.

(21) Appl. No.: 13/290,764

(22) Filed: Nov. 7, 2011

(65) Prior Publication Data
US 2012/0194207 A1    Aug. 2, 2012

Related U.S. Application Data

(60) Continuation-in-part of application No. 12/852,419, filed on Aug. 6, 2010, now Pat. No. 8,053,267, which is a division of application No. 11/649,992, filed on Jan. 4, 2007, now Pat. No. 7,772,657, which is a
(Continued)

(51) Int. Cl.
| | |
|---|---|
| *G01R 31/26* | (2014.01) |
| *G06F 3/0338* | (2013.01) |
| *G01L 5/16* | (2006.01) |
| *G01L 5/22* | (2006.01) |
| *B81C 99/00* | (2010.01) |

(52) U.S. Cl.
CPC .............. *G06F 3/0338* (2013.01); *G01L 5/162* (2013.01); *G01L 5/223* (2013.01); *B81C 99/0045* (2013.01)

(58) Field of Classification Search
CPC ..... G01L 5/162; G01L 5/223; B81C 99/0045; G06F 3/0338
USPC ....................... 438/14, 16, 17, 18; 324/750.01
See application file for complete search history.

(56) References Cited

U.S. PATENT DOCUMENTS

| | | | |
|---|---|---|---|
| 4,615,258 | A | 10/1986 | Hirmann |
| 4,680,577 | A | 7/1987 | Straayer et al. |

(Continued)

FOREIGN PATENT DOCUMENTS

| | | |
|---|---|---|
| JP | 03-216529 | 9/1991 |
| JP | 61-149316 | 5/1994 |

(Continued)

OTHER PUBLICATIONS

PCT; International Search Report corresponding to International Patent Application No. PCT/US2007/00411; mailed Oct. 4, 2007; 3 Pages.

(Continued)

*Primary Examiner* — Khiem D Nguyen
(74) *Attorney, Agent, or Firm* — Fitch, Even, Tabin & Flannery LLP

(57) ABSTRACT

Some embodiments provide methods, process, systems and apparatus for use in testing multi-axis Micro Electro Mechanical Systems (MEMS) devices. In some embodiments, methods of testing are provided, comprising: selecting, according to a test specification and a test program, at least a first MEMS device on a substrate comprising a plurality of MEMS formed relative to the substrate and applying one or more electrical probes to the first MEMS device; providing power to the first MEMS device through the one or more electrical probes; measuring output signals of the first MEMS device; applying a force to the first MEMS device using a force actuator; measuring a set of output signals of the first MEMS device based on the applied force; and processing test data and generating output test results according to the test specification and test program.

15 Claims, 30 Drawing Sheets

Related U.S. Application Data continuation-in-part of application No. 11/025,642, filed on Dec. 28, 2004, now Pat. No. 7,554,167.

(60) Provisional application No. 60/533,409, filed on Dec. 29, 2003, provisional application No. 60/756,200, filed on Jan. 5, 2006.

(56) References Cited

U.S. PATENT DOCUMENTS

| | | |
|---|---|---|
| 4,840,060 A | 6/1989 | Notz et al. |
| 4,891,985 A | 1/1990 | Glenn |
| 4,951,510 A | 8/1990 | Holm-Kennedy et al. |
| 4,967,605 A | 11/1990 | Okada |
| 5,035,148 A | 7/1991 | Okada |
| 5,263,375 A | 11/1993 | Okada |
| 5,489,900 A | 2/1996 | Cali et al. |
| 5,499,041 A | 3/1996 | Brandenburg et al. |
| 5,600,074 A | 2/1997 | Marek et al. |
| 5,604,314 A | 2/1997 | Grahn |
| 5,640,178 A | 6/1997 | Endo et al. |
| 5,682,000 A | 10/1997 | Okada |
| 5,703,393 A | 12/1997 | Yamaguchi |
| 5,760,313 A | 6/1998 | Guentner et al. |
| 6,121,954 A | 9/2000 | Seffernick |
| 6,185,814 B1 | 2/2001 | Okada |
| 6,195,082 B1 | 2/2001 | May et al. |
| 6,211,558 B1 | 4/2001 | Ismail et al. |
| 6,369,435 B1 | 4/2002 | Igel |
| 6,373,265 B1 | 4/2002 | Morimoto et al. |
| 6,388,299 B1 | 5/2002 | Kang et al. |
| 6,441,503 B1 | 8/2002 | Webster |
| 6,477,903 B2 | 11/2002 | Okada |
| 6,518,954 B1 | 2/2003 | Chen |
| 6,523,423 B1 | 2/2003 | Namerikawa et al. |
| 6,530,283 B2 | 3/2003 | Okada et al. |
| 6,534,711 B1 | 3/2003 | Pollack |
| 6,570,556 B1 | 5/2003 | Liao et al. |
| 6,642,857 B1 | 11/2003 | Schediwy et al. |
| 6,654,004 B2 | 11/2003 | Hoggarth |
| 6,654,005 B2 | 11/2003 | Wang |
| 6,697,049 B2 | 2/2004 | Lu |
| 6,707,445 B1 | 3/2004 | Hasemann |
| 6,750,408 B2 | 6/2004 | Inoue et al. |
| 6,753,850 B2 | 6/2004 | Poole |
| 6,771,992 B1 | 8/2004 | Tomura et al. |
| 6,774,887 B2 | 8/2004 | Lu |
| 6,787,865 B2 | 9/2004 | Endo et al. |
| 6,788,291 B2 | 9/2004 | Burry |
| 6,791,532 B2 | 9/2004 | Hirano et al. |
| 6,809,529 B2 | 10/2004 | Okada et al. |
| 6,809,721 B2 | 10/2004 | Love |
| 6,859,048 B2 | 2/2005 | Okada et al. |
| 6,903,724 B2 | 6/2005 | Grivas et al. |
| 6,920,041 B2 | 7/2005 | Oross et al. |
| 6,940,495 B2 | 9/2005 | Morimoto et al. |
| 6,950,092 B2 | 9/2005 | Buss |
| 6,952,197 B1 | 10/2005 | Nakamura et al. |
| 7,123,028 B2 | 10/2006 | Okada et al. |
| 7,123,240 B2 | 10/2006 | Kemppinen |
| 7,242,273 B2 | 7/2007 | Isobe et al. |
| 7,262,071 B2 | 8/2007 | Lärmer et al. |
| 7,273,767 B2 | 9/2007 | Ong et al. |
| 7,367,232 B2 | 5/2008 | Vaganov et al. |
| 7,441,470 B2 | 10/2008 | Morimoto |
| 7,448,861 B2 | 11/2008 | Koike et al. |
| 7,453,085 B2 | 11/2008 | Chang et al. |
| 7,476,952 B2 | 1/2009 | Vaganov et al. |
| 7,554,167 B2 | 6/2009 | Vaganov |
| 7,657,128 B2 | 2/2010 | Silverbrook et al. |
| 7,772,657 B2 | 8/2010 | Vaganov |
| 7,880,247 B2 | 2/2011 | Vaganov et al. |
| 7,898,532 B2 | 3/2011 | Lapstun et al. |
| 7,928,967 B2 | 4/2011 | Underwood et al. |
| 8,004,052 B2 | 8/2011 | Vaganov |
| 8,053,267 B2 | 11/2011 | Vaganov |
| 2001/0003326 A1 | 6/2001 | Okada et al. |
| 2002/0075234 A1 | 6/2002 | Poole |
| 2002/0149564 A1 | 10/2002 | Simpson et al. |
| 2002/0151282 A1 | 10/2002 | Wang |
| 2002/0190949 A1 | 12/2002 | Hirano et al. |
| 2003/0030452 A1 | 2/2003 | Okada et al. |
| 2003/0052861 A1 | 3/2003 | Peng |
| 2003/0076302 A1 | 4/2003 | Langstraat |
| 2003/0094663 A1 | 5/2003 | Sato et al. |
| 2003/0105076 A1 | 6/2003 | Ansari et al. |
| 2003/0105576 A1 | 6/2003 | Kamiya et al. |
| 2004/0027331 A1 | 2/2004 | Mochizuki et al. |
| 2004/0102858 A1 | 5/2004 | Kesil et al. |
| 2004/0189334 A1* | 9/2004 | Deng et al. ............... 324/754 |
| 2004/0222968 A1 | 11/2004 | Endo et al. |
| 2004/0227732 A1 | 11/2004 | Kemppinen |
| 2005/0160814 A1 | 7/2005 | Vaganov et al. |
| 2005/0161489 A1 | 7/2005 | Pikulski |
| 2005/0170544 A1 | 8/2005 | Chang et al. |
| 2005/0178214 A1 | 8/2005 | Okada et al. |
| 2005/0190152 A1* | 9/2005 | Vaganov ................... 345/157 |
| 2005/0190159 A1 | 9/2005 | Skarine |
| 2005/0217386 A1 | 10/2005 | Hirose et al. |
| 2006/0220803 A1 | 10/2006 | Kranz et al. |
| 2007/0000335 A1 | 1/2007 | Morimoto |
| 2007/0245836 A1 | 10/2007 | Vaganov |
| 2007/0264743 A1* | 11/2007 | Vaganov et al. .............. 438/51 |
| 2008/0105936 A1 | 5/2008 | Nakamura |
| 2009/0259412 A1 | 10/2009 | Brogardh |
| 2010/0252897 A1 | 10/2010 | Seeger et al. |
| 2011/0298705 A1 | 12/2011 | Vaganov |

FOREIGN PATENT DOCUMENTS

| | | |
|---|---|---|
| JP | 2007-010379 A | 1/2007 |
| WO | 2007081883 A2 | 7/2007 |
| WO | 2007139730 A2 | 12/2007 |

OTHER PUBLICATIONS

PCT; International Search Report and Written Opinion of the International Searching Authority corresponding to International Patent Application No. PCT/US2007/11988; mailed Jul. 28, 2008; 11 Pages.

USPTO; Non-Final Office Action corresponding to U.S. Appl. No. 11/025,642; mailed Aug. 28, 2008; 6 Pages.

USPTO; Notice of Allowance corresponding to U.S. Appl. No. 11/804,954; mailed Sep. 4, 2008; 8 Pages.

USPTO; Notice of Allowance corresponding to U.S. Appl. No. 11/025,642; mailed Feb. 23, 2009; 7 Pages.

Austrian Patent Office; Written Opinion by the Austrian Patent Office corresponding to Singapore Patent Application No. 200800396-4; mailed Sep. 29, 2009; 4 Pages.

USPTO; Non-Final Office Action corresponding to U.S. Appl. No. 11/649,992; mailed Oct. 5, 2009; 24 Pages.

The State Intellectual Property Office of the People's Republic of China; First Office Action including translation corresponding to Application No. 200780000772.3; dispatched Oct. 9, 2009; 24 Pages (1-13 Translation, 14-24 Office Action).

USPTO; Notice of Allowance corresponding to U.S. Appl. No. 12/477,076; mailed Apr. 8, 2011; 5 Pages.

The State Intellectual Property Office of the People's Republic of China; Notice on the Second Second Office Acion including translation corresponding to Application No. 200780000772.3; dispatched Apr. 8, 2010; 18 Pages (1-10 Translation, 11-18 Office Action).

USPTO; Notice of Allowance corresponding to U.S. Appl. No. 11/649,992; mailed Apr. 15, 2010; 6 Pages.

European Patent Office; Supplementary European Search Report for Application No. EP 07 70 9602; mailed May 7, 2010; 6 Pages.

The State Intellectual Property Office of the People's Republic of China; Notice on the First Office Action including translation corresponding to Application No. 200780019052.1; dispatched May 14, 2010 8 Pages (1-5 Translation, 6-8 Office Action).

(56) References Cited

OTHER PUBLICATIONS

USPTO; Supplemental Notice of Allowance corresponding to U.S. Appl. No. 11/649,992; mailed Jun. 29, 2010; 2 Pages.
USPTO; Notice of Allowance corresponding to U.S. Appl. No. 12/852,419; mailed Jul. 6, 2011; 7 Pages.
Austrian Patent Office; Second Written Opinion by the Austrian Patent Office corresponding to Singapore Patent Application No. 200800396-4; mailed Jul. 9, 2010; 5 Pages.
The State Intellectual Property Office of the People's Republic of China; Notice on the Third Office Action including translation corresponding to Application No. 200780000772.3; dispatched Jul. 30, 2010; 9 Pages (1-5 Translation, 6-9 Office Action).
PCT; International Search Report corresponding to International Patent Application No. PCT/US2009/069091; mailed Aug. 17, 2010; 3 Pages.
Canadian Intellectual Property Office; Office Action corresponding to Canadian Patent Application No. 2,615,711; dated Sep. 7, 2010; 2 Pages.
USPTO; Notice of Allowance corresponding to U.S. Appl. No. 12/342,001; mailed Sep. 27, 2010; 4 Pages.
USPTO; Non-Final Office Action corresponding to U.S. Application No. 12/477,076; mailed Nov. 4, 2010; 10 Pages.
The State Intellectual Property Office of the People's Republic of China; Notice on the Fourth Office Action including translation corresponding to Application No. 200780000772.3; dispatched Nov. 11, 2010; 8 Pages (1-5 Translation, 6-8 Office Action).
USPTO; Supplemental Notice of Allowance corresponding to U.S. Appl. No. 12/342,001; mailed Nov. 17, 2010; 3 Pages.
USPTO; Supplemental Notice of Allowance corresponding to U.S. Appl. No. 12/342,001; mailed Dec. 2, 2010; 2 Pages.
Japanese Patent Office; Official Notice of Rejection issued in Japanese Patent Application No. 2008-549595; Mailed Feb. 17, 2012; 7 pages including translation.
USPTO; Notice of Allowance issued in U.S. Appl. No. 13/215,057; Mailed Jun. 22, 2012; 11 Pages.
USPTO; Notice of Allowance issued in U.S. Appl. No. 13/215,057; Mailed Sep. 7, 2012; 9 Pages.

\* cited by examiner

PRIOR ART

METHOD OF TESTING OF MEMS DEVICES ON A WAFER LEVEL

This application is a continuation-in-part of U.S. application Ser. No. 12/852,419, filed Aug. 6, 2010, for Vladimir Vaganov, entitled THREE-DIMENSIONAL FORCE INPUT CONTROL DEVICE AND FABRICATION, now U.S. Pat. No. 8,053,267, which is a Divisional of U.S. application Ser. No. 11/649,992, filed Jan. 4, 2007, for Vladimir Vaganov, entitled THREE-DIMENSIONAL FORCE INPUT CONTROL DEVICE AND FABRICATION, now U.S. Pat. No. 7,772,657, which is a Continuation-In-Part of U.S. application Ser. No. 11/025,642, filed Dec. 28, 2004, for Vladimir Vaganov, entitled THREE-DIMENSIONAL ANALOG INPUT CONTROL DEVICE, now U.S. Pat. No. 7,554,164, which claims the benefit of U.S. Provisional Application No. 60/533,409, filed Dec. 29, 2003, for Vladimir Vaganov entitled THREE-DIMENSIONAL ANALOG INPUT POINTING MICRO-DEVICE; and U.S. application Ser. No. 11/649,992 further claims the benefit of U.S. Provisional Application No. 60/756,200, filed Jan. 5, 2006, for Vladimir Vaganov, entitled THREE-DIMENSIONAL ANALOG INPUT CONTROL DEVICE AND FABRICATION METHOD, all of which are incorporated in their entirety herein by reference.

BACKGROUND

1. Field of the Invention

This invention relates to Micro Electro Mechanical Systems (MEMS), and more specifically testing of MEMS.

2. Background

Wafer-level testing is used by semiconductor industry for evaluating results of wafer processing and selecting good devices for assembly. Electrical testing of integrated circuits can provide information for selecting chips.

SUMMARY OF THE PRESENT EMBODIMENTS

Some embodiments provide methods of electromechanical testing of MEMS devices on a wafer are disclosed. In some implementations, the method comprises: selecting, according to a test specification and a test program, at least a first MEMS device on a substrate comprising a plurality of MEMS formed relative to the substrate and applying one or more electrical probes to at least the first MEMS device; providing power to at least the first MEMS device through the one or more electrical probes; measuring output signals of the first MEMS device; applying a force to at least the first MEMS device using a force actuator; measuring a set of output signals of the first MEMS device based on the applied force; and processing test data and generating output test results according to the test specification and test program; wherein the force actuator used to apply force to the first MEMS device is chosen from the group of actuators comprising: mechanical actuator, magnetic actuator, electromagnetic actuator, electrostatic actuator, thermal actuator and piezoelectric actuator.

Further, some embodiments provide methods of electromechanical testing of MEMS devices on a wafer. These method comprise steps of: providing a wafer with MEMS devices for testing; providing a test system comprising electrical contacts to at least one testing MEMS device and at least some tangible components of a force actuator configured to apply force to at least the testing MEMS device; providing a test specification and a test program; selecting at least the testing MEMS device according to the test program and applying electrical probes to at least the testing MEMS device; providing power to at least the testing MEMS device through electrical probes; measuring a first set of output signals of the testing MEMS device; applying force to at least the testing MEMS device using the force actuator; measuring a second set of output signals of the testing MEMS device with applied force; determining whether one or more MEMS devices have been tested according to the test program and choosing the next step, based on whether the one or more MEMS devices have been tested, from the group of steps comprising: returning back to the group of steps starting with selecting at least one MEMS device for testing; or moving further to a step of processing test data; in a later case the next step would be processing the test data and generate output test results according to the test specification and test program; wherein the force is applied to testing MEMS device after relative motion of the testing MEMS device and at least one tangible component of the force actuator toward each other.

Still further, some embodiments provide methods of electromechanical testing of MEMS devices on a wafer. These methods comprise: providing a wafer with MEMS devices for testing; providing a test system comprising electrical contacts to at least a testing MEMS device and at least some components of a force actuator configured to apply force to at least the testing MEMS device; providing a test specification and a test program; selecting at least the testing MEMS device according to the test program and applying one or more electrical probes to the testing MEMS device; providing power to at least the testing MEMS device through the one or more electrical probes; measuring a first set of output signals of the testing MEMS device; applying force to the testing MEMS device under at least two different test conditions using the force actuator to apply forces, the two different test conditions are chosen from the group of: one or more forces applied in at least two different locations, and one or more forces applied in at least two non-collinear directions; measuring a second set of output signals of the testing MEMS device while the force under at least two different test conditions is applied; determining whether MEMS devices have been tested according to the test program, and choosing the next step, based on whether the MEMS devices have been tested according to the test program, from the group of steps comprising of: returning back to the group of steps starting with selecting at least one next MEMS device for testing; moving further to the step of processing test data; processing the test data and generating output test results according to the test specification and test program; whereby at least the second set of output signals corresponding to at least the two different test conditions of applied force are linearly independent, which, after processing, results in characterization of multi-axis MEMS device as at least two-axis MEMS device.

Additionally, some embodiments provide test systems and/or apparatuses configured to test MEMS devices. Some of these systems comprise: X-Y-Z stage configured to automate positioning of a wafer with multi-axis force-sensitive MEMS devices for testing, the X-Y-Z stage comprising a chuck configured to hold the wafer; probe card with one or more probes configured to make electrical contact to at least one of the multi-axis force-sensitive MEMS devices; force actuator configured to apply force to the at least one multi-axis force-sensitive MEMS device in one or more different directions of applied vector force; data acquisition equipment configured to condition and convert electrical signals from the at least one multi-axis force-sensitive MEMS device into digital data; and digital processor and software implemented by at least the processor such that the processor in implementing the software is configured to process the digital data from data acquisition equipment, control the X-Y-Z stage, control the force actuator, generate results of from testing and communicate with information infrastructure objects chosen from the group of: a computer, a server, a storage device, a peripheral device, a network, a test operator, and combination thereof; wherein for the purpose of testing of the at least one multi-axis force-sensitive MEMS device the force actuator provides different test conditions chosen from the group of: applying force in at least two different locations, applying force in at least two non-collinear directions, applying torque, applying torque in different directions and applying force of different magnitude or combination.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION

Figure 1:
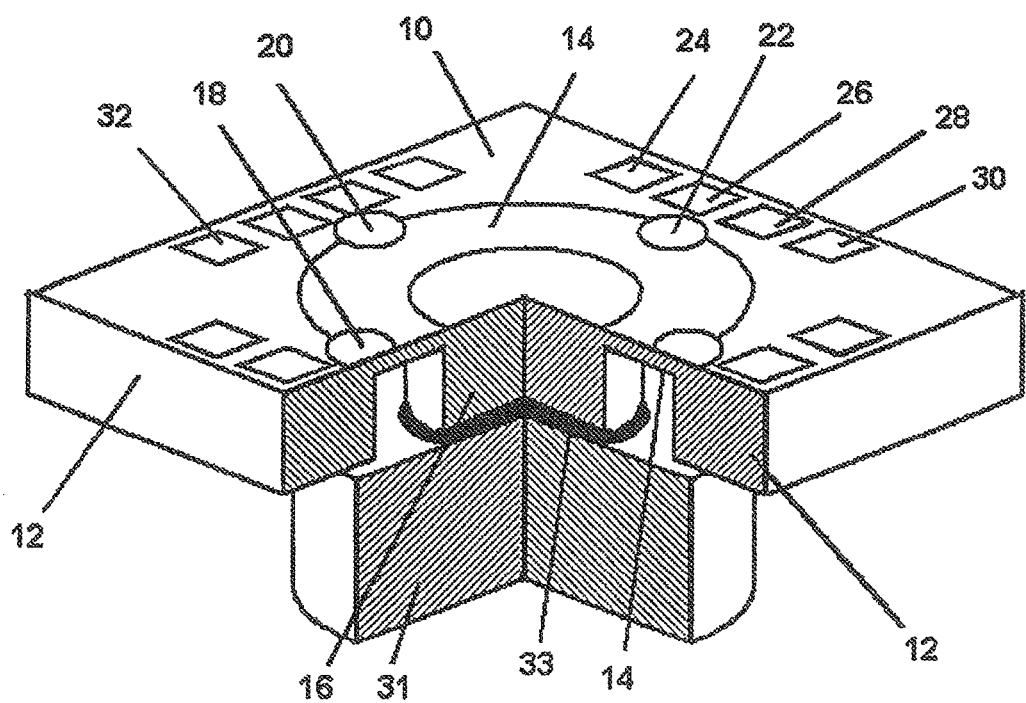
FIG. 1 shows a prior art 3D force sensor chip with rigid force transferring island located within the thickness dimension of a die and additional force transferring element connected to the top portion of the rigid island.

Some embodiments relate to Micro Electro Mechanical Systems (MEMS), sensors and to wafer-level testing of MEMS devices, including, for example, force sensitive devices.

Wafer-level testing can be used in evaluating results of wafer processing and the selection of devices for assembly. Electrical testing of integrated circuits can in some instances provide enough information for selecting good chips. In case of MEMS devices electrical testing may be not enough. Additional mechanical, optical, chemical or other stimulus is often needed, in some embodiments, in order to verify proper functionality of MEMS devices and make sure that their parameters are in spec.

Some test methods employing non-electrical stimuli in wafer-level testing of MEMS devices are known (see for example, the paper entitled: "Microprobe for Mechanical Testing of MEMS", EuroSensors'99; and U.S. Pat. No. 4,733, 533 "Method and apparatus for low pressure testing of a solid state pressure sensor", both of which are incorporated herein by reference). However, known methods of wafer-level testing of MEMS devices are often either applicable to sensors of a scalar parameter, as pressure, or require long testing time per device and, therefore, have unacceptably high cost in high volume manufacturing, as in case of some MEMS devices for consumer applications.

Some current embodiments, however, provide methods of wafer-level functional testing of MEMS devices having multi-axis sensors, actuators or other micro-electromechanical or micromechanical components, which functionality can be tested by applying force and reading back an electrical signal. In some instances, these can provide low-cost testing. Functional testing of MEMS devices on wafer-level is crucial for decreasing cost of final product by both rejecting devices before any assembly steps and providing quick feedback to a product line.

Some embodiments provide test systems and methods of wafer-level electro-mechanical testing of MEMS devices suitable for high-volume manufacturing, as for example, manufacturing of MEMS devices for consumer markets, such as cell phones, portable gaming devices, remote controls, PDA, digital cameras, etc. Further, the some present embodiments provide testing solutions for MEMS devices having either one or multiple sensitive axes. Additionally, some embodiments provide low-cost testing methods of MEMS devices on wafer level. Still further, some embodiments provide high-productivity methods of wafer-level electromechanical testing of MEMS devices. Furthermore, embodiments provide solutions for electromechanical testing of MEMS devices on wafer over temperature range.

Some embodiments provide a 3-dimensional force input control device for high volume consumer markets like cell phones, portable garners, digital cameras, etc.

Additionally, some embodiments provide a method of fabrication of a 3-dimensional force input control device used for integrating in various functions in electronic devices.

Further, some embodiments provide a low cost 3-dimensional force input control device.

Further embodiments provide a finger tip size 3-dimensional force input control device.

Additionally, some embodiments provide a high reliability 3-dimensional force input control device.

Some embodiments provide a high stability 3-dimensional force input control device.

In some instances, embodiments provide a 3-dimensional force input control device, which accommodates a sufficiently low noise ratio between X, Y, Z sensitivities.

Furthermore, some embodiments provide a 3-dimensional force input control device, which has low cross-axis sensitivity.

Yet further embodiments provide a 3-dimensional force input control device, which allows process integration with other sensors and CMOS.

Some embodiments provide a 3-dimensional force input control device, which is scalable.

Some embodiments provide a 3-dimensional force input control device with required combination of applied force and deflection.

Further embodiments provide a 3-dimensional force input control device, which enables better economics of manufacturability for high volume consumer markets.

The 3D force sensors based on micromachined silicon chips with piezoresistors on the flexible diaphragm are known. FIG. 1 shows a sensor chip 10 with a rigid frame 12 and rigid central part 16 of a die, boss, connected with the frame by a thinner diaphragm 14. The piezoresistors 18,24 are located at the periphery of the diaphragm adjacent to the frame 12 and to piezoresistors 20, 22 are adjacent to the boss 16 and electrically connected into three Wheatstone bridges through contact pads 26,28,30,32 accommodating X, Y and Z components of an applied force vector. The disadvantages of these kinds of known solutions can be summarized as: poor long-term stability due to the metal on the suspension; limited mechanical overload protection; large difference in X, Y, Z sensitivities; large cross-axis sensitivity; no process integration with other sensors and CMOS; no scaling; no solutions for convenient application from an external force; no solutions for providing required combination of applied force and deflection. Furthermore although there is a market need, no such semiconductor components reached the consumer market due to their high cost.

However there is a need for 3-dimensional input force control devices, which would be low cost, small, reliable, stable, providing required ratio between X, Y, Z sensitivities, low cross axis sensitivity, process integration with other sensors and CMOS, further scaling, convenient solutions for applying an external force, required combination of applied force and deflection and manufacturability for high volume consumer markets like cell phones, portable gamers, digital cameras, etc, using user tactile force inputs as part of the user interface. Furthermore, the need for 3-dimensional input control extends beyond X, Y, Z rectilinear coordinate system to any orthogonal system position translation mappings or non-position dimensionality component mappings as well.

PRESENT EMBODIMENTS

FIGS. 2-13 show various embodiments of 3D force input control devices, dice microstructures and fabrication methods. The detailed description of the microstructures, devices and methods of fabrication according to the present invention are presented below.

Referring to embodiments in FIGS. 2a-b, the isometric and a cross section view of the top planar side of a force sensor die and its major micro-constructive elements are shown. The isometric bottom side reflection and cross sectional view of the die are shown in FIG. 2b. The die 10 has frame 12 surrounding an elastic element 14. In this embodiment the elastic element 14 is circular and acts as a diaphragm. A central rigid island 16 is coupled to and within the center of the diaphragm 14. On a circular diaphragm 14 planar top side there are a number of areas 18, 20, 22 where mechanical stress sensitive IC components are effectively located. The IC components 18, 20, 22 are located on the periphery of the diaphragm adjacent to a frame 12, and electrically connected to contact pads 24 26 28 30 32 without metal conductors on the surface of a diaphragm. This configuration yields better sensor stability. Stress sensitive IC components 18 20 22 can also be located on the other areas of the diaphragm, for example in the areas 19, 21, 23, as shown in FIG. 2a.

The stress sensitive components occupy a relatively small area on the surface of the die. The majority of the area is used for integration of the signal processing IC. These IC can be located on the frame area 11, or on the rigid island area 13 or even on the elastic element area 14. As the process of stress sensitive components is compatible with the regular CMOS process, then any integrated circuit, which can be fabricated with CMOS process, can be integrated at the same die. In particular these integrated IC can provide the functions of analog signal amplification, analog analog-to-digital and digital-to-analog conversion, multiplexing, signal processing, gate logic, memory, digital interface, power management, encryption, compression and decompression, mixed signal processing, transmitting and receiving wireless signals, sensing various physical domains other than force and combinations.

An externally applied force is transferred to the rigid island 16, the deflection of the island creates deformation and stress in the elastic diaphragm element 14, reaching the locations of the stress sensitive IC components 18, 20, 22. These at least three sensitive IC components create a unique combination of the signals relative to a specific value and direction of the applied vector force. Calibration and processing sensor signals by integrated IC allows determination of the values of the force vector components and therefore also the value and a direction of the externally applied force.

Figure 2:
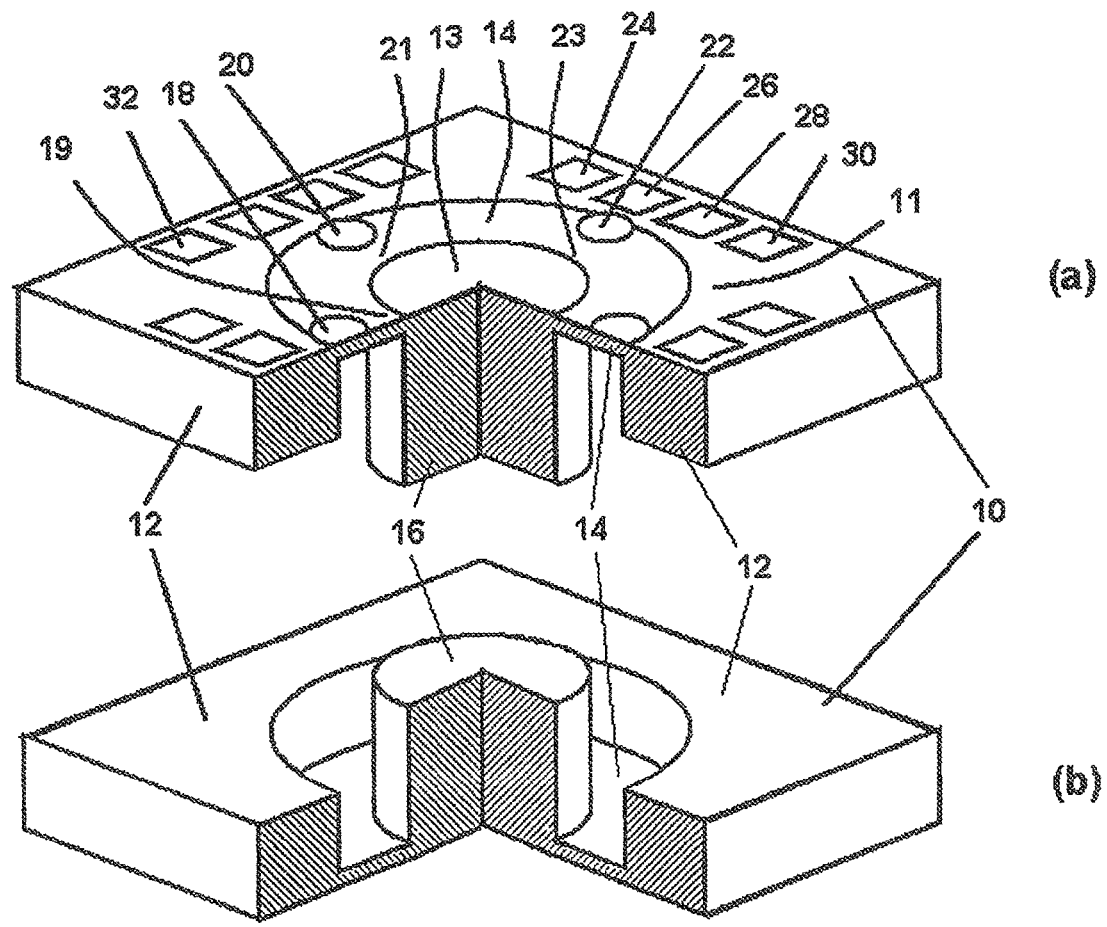
FIG. 2 shows an isometric top and bottom views of a force sensor die and its major micro-constructive elements according to an embodiment of the present invention.

In another embodiment, illustrated in the FIG. 2, the rigid island 16 located within the die 10 protrudes out from the frame 12, or has larger dimension of height than the thickness of the frame 12 minus the thickness of the diaphragm 14. It allows more efficiently apply an external force in lateral X and Y directions, provides high sensitivity, and simplifies the geometrical microstructure of the sensor die. The cost of manufacturing of the device is consequently reduced substantially due to the elimination of need for an additional wafer and corresponding processing steps. The described embodiment microstructure enhances sensor sensitivity to the applied vector force in all three orthogonal directions. These components of force are transferred directly to a rigid island of the sensor die and then to an elastic element and sensitive IC components.

The challenge of practical application of 3D force sensors, as input force controlled devices, is that the deflection of the rigid island 16 in semi-conductor type materials is negligible. The psychological response to the control of the applied force is based on the applied force or, for example pressure on the finger. For good finger control, some range of deflection is required, and this range would also increase the accuracy of applying input signals matching a range of applied force and sensitivity of the device.

Figure 3:
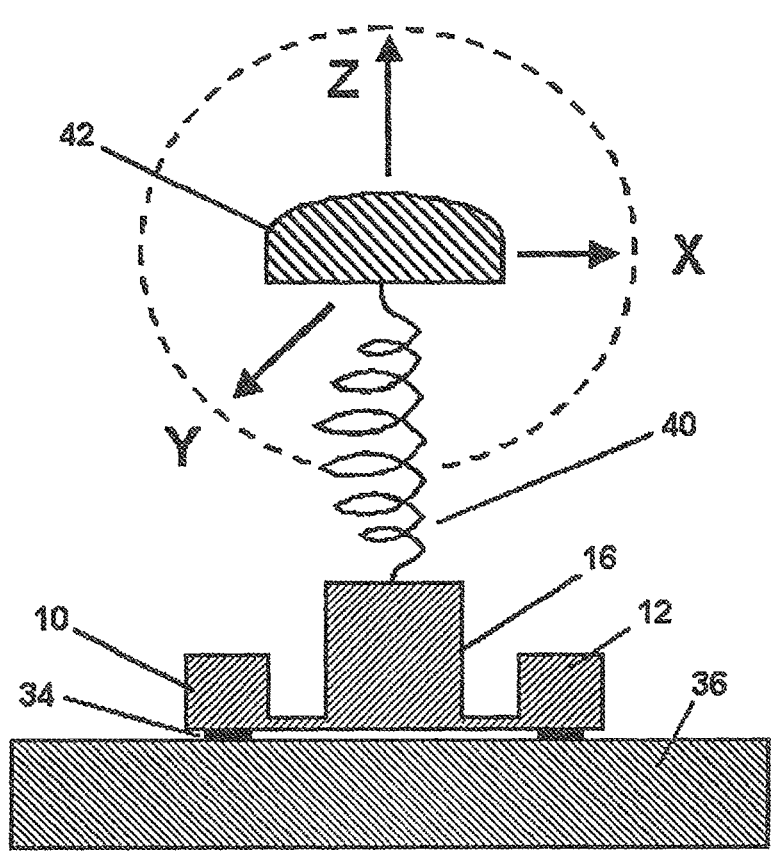
FIG. 3 shows the principle of a 3-dimensional input finger control of different functions in hand-held devices, where 3D force sensor die is connected to the external button for applying the force through a spring like element allowing control to achieve the required combination of sensitivity, range and accuracy of applied force or deflection according to an embodiment of the present invention.

An aspect of the invention resolving this issue is illustrated in FIG. 3 according to a third embodiment. A two ended spring element 40 is added to a sensor. The first end of spring element 40 is coupled to a rigid island 16 of a sensor die 10, which has a frame 12 and contact pads 34. The second end of the spring element 40 is connected to a button 42, where the external force vector is applied. The spring element 40 phases the deflection, increases the range of motion or applied force and accuracy of the input mechanical signal. As another benefit, the spring element 40 also increases the range of the opportunities in designing the microstructure of the sensor die for better performance from variable stiffness, reliability and cost.

Figure 4:
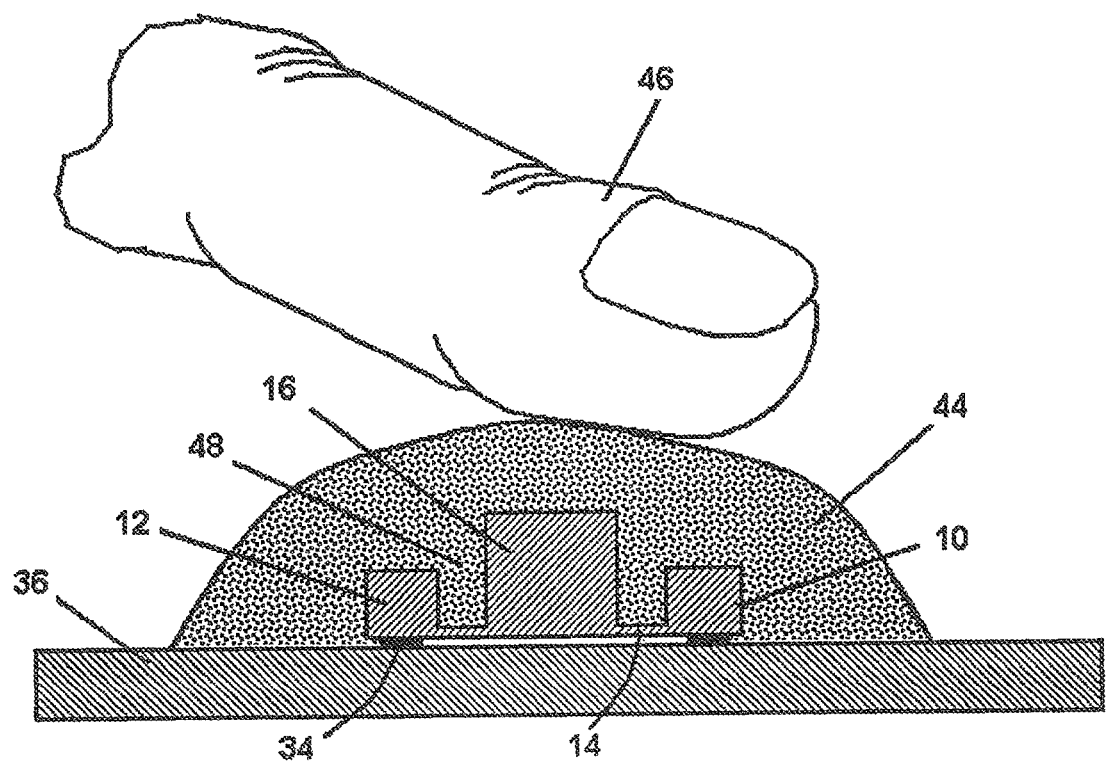
FIG. 4 shows an example of a flat low profile finger force control device based on elastomeric button directly connected to the force sensor die in accordance with an embodiment of the present invention.

As illustrated in FIG. 4, for some finger mouse applications, there is a need for a small but responsive deflection of a button and input force controlled devices. These are satisfied by shaping a flat button according to another embodiment of the invention. A sensor die 10 is bonded to a substrate 36 with the contact pads 34. The sensor die 10 is covered with elastic plastic material 44 forming a desired shape of a button.

The external force is applied to an elastic button, for example by a finger 46. Normal and sheer force are transferred through the elastic material of a button to the rigid island 16, elastic element 14 and finally to the stress sensitive IC components, result in output electrical signals proportional to an applied external force.

The size of a sensor die and the viscosity and elasticity of an elastic material of the plastic button determine the response characteristics of the sensor to a large degree. The elastic plastic material 44 covers the sensor die 10 directly from the back profiled side and might filling in the cavity 48 between the frame 12 and the rigid island 16. Normal and sheer force applied by a force are transferred through the elastic material of a button directly to the rigid island 16 and then to the stress sensitive IC components.

Figure 5:
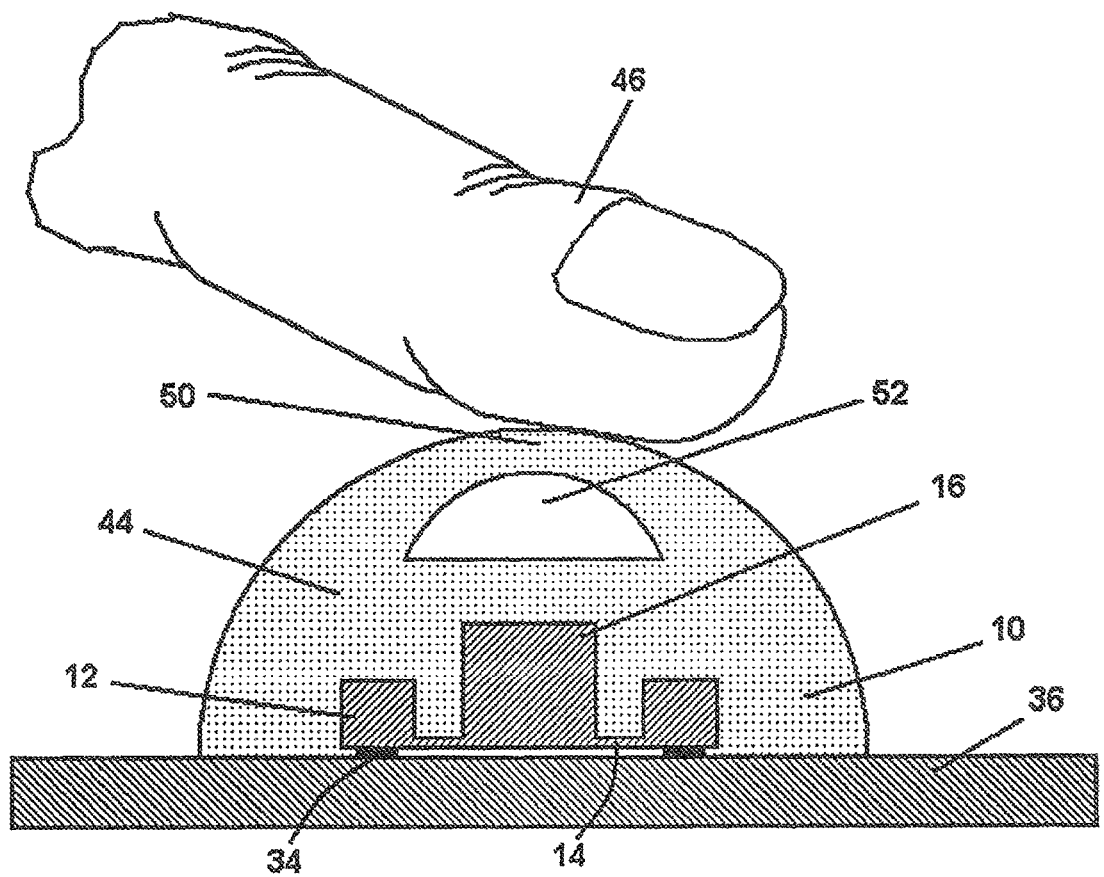
FIG. 5 illustrates a flat finger force control device with an elastomeric button directly connected to the rigid force-transferring element and comprising a tactile sensation mechanical feedback for sensing the click of a depressed button in accordance with an embodiment of the present invention.

In many applications X and Y components of a force vector are used for a navigation by cursor on the screen of an electronic device while. When position of a cursor is selected then the action button is actuated. In most cases this action button is separated from the X-Y cursor navigation system like in finger point mouse of IBM Think Pad. Action button especially in portable devices preferably requires mechanical feedback or mechanical clicking function, which can be sensed by tactile sensors of the finger. As proposed finger force control device combines X, Y and Z control functions in one 3D sensor, Z control can be used as an action button eliminating the need for a separate control action button. The mechanical clicking feedback function can be incorporated in the device, as illustrated in FIG. 5, according to the fifth embodiment of the present invention.

The sensor die 10 is bonded to a substrate 36 with the contact pads 34. The sensor die 10 is covered with elastic plastic material 44 forming a desired shape of a button. The external force is applied to an elastic button, for example by a finger 46. Normal and Sheer force are transferred through the elastic material of a button to the rigid island 16, elastic element 14 and finally to the stress sensitive IC components, which result in output electrical signals proportional to X and Y components of the external force.

In the top portion of the elastic plastic button the tactile sensation mechanical feedback allows sensing the click of the pressed button, because it has a springy shell structure 50 with the cavity 52 beneath. When pressed from the top it buckles slightly, retaining continuity but sending a click sensation to the finger 46. This springy shell can be made from different materials including metals and plastics. The buckling action creates not only a tactile feedback but also generates short pulses in the mechanical sensitive components, which can be used as signals for activation of certain electronic action.

Figure 6:
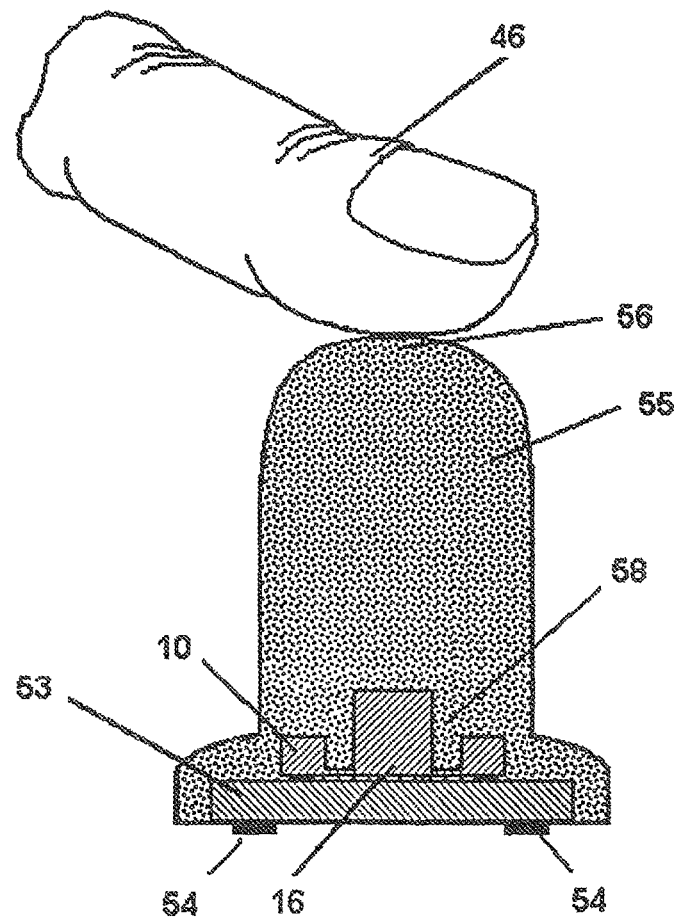
FIG. 6 shows an example of a joystick type finger force control device based on a elastomeric protrusion body spring back deformable element directly coupled with the rigid force-transferring element transferring the force vector to the sensor die mounted on the intermediate substrate die in accordance with an embodiment of the present invention.

As illustrated in FIG. 6, the spring element 54 providing required range of deflection and sensitivity can be made from the elastic plastic material according to sixth embodiment. In this embodiment the sensor die 10 and the rigid force-transferring island 16 are mounted on the intermediate substrate 53, which has contact pads 54. The elastic plastic package material 55 covers the above elements and forms a flexible protrusion. The extended end of the protrusion 56 serves as a button for tactile contact. An external force applied, via finger 46, to a button 56 bends the protrusion 55 creating mechanical stress and deflection within the plastic in the device base area 58 between the sensor die and the rigid force-transferring island 16. This induced stress is transferred to the sensor die and finally to the stress sensitive IC components. This design of a micro-joystick allows achieving very low cost in production due to its design simplicity and existing well-developed mass manufacturing technologies.

Figure 7:
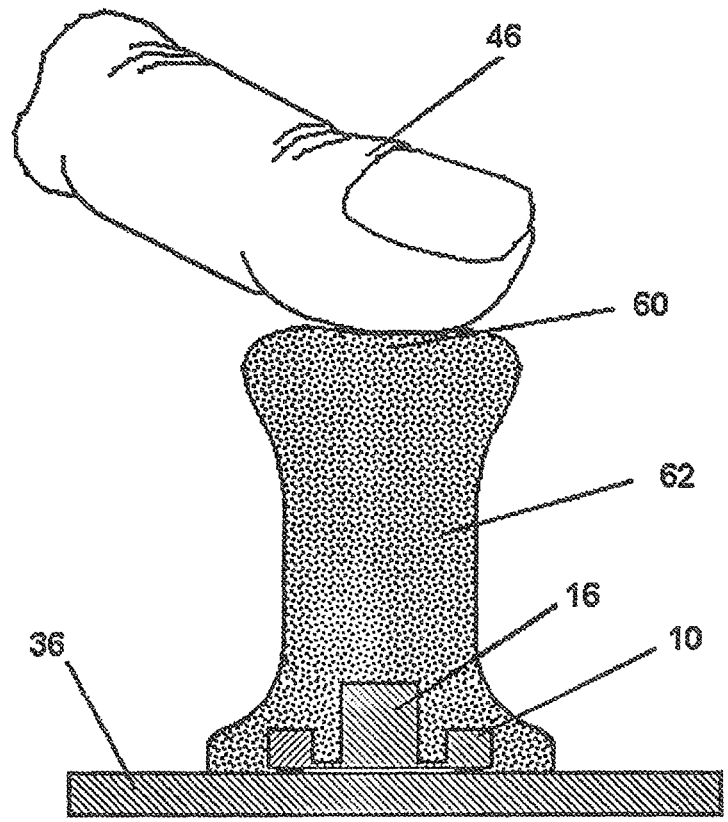
FIG. 7 shows another example of a flattened head joystick type finger force control device, where sensor die is mounted directly to the PCB in accordance with an embodiment of the present invention.

Another embodiment of a plastic elastic finger joystick with flattened head 60 at the protruding end of the stick is shown in FIG. 7. The plastic stick 62 can be fabricated in various shapes, colors and elasticity, depending on the application and requirements. In this embodiment the sensor die 10 is mounted directly to the PCB 36 of an electronic device.

Figure 8:
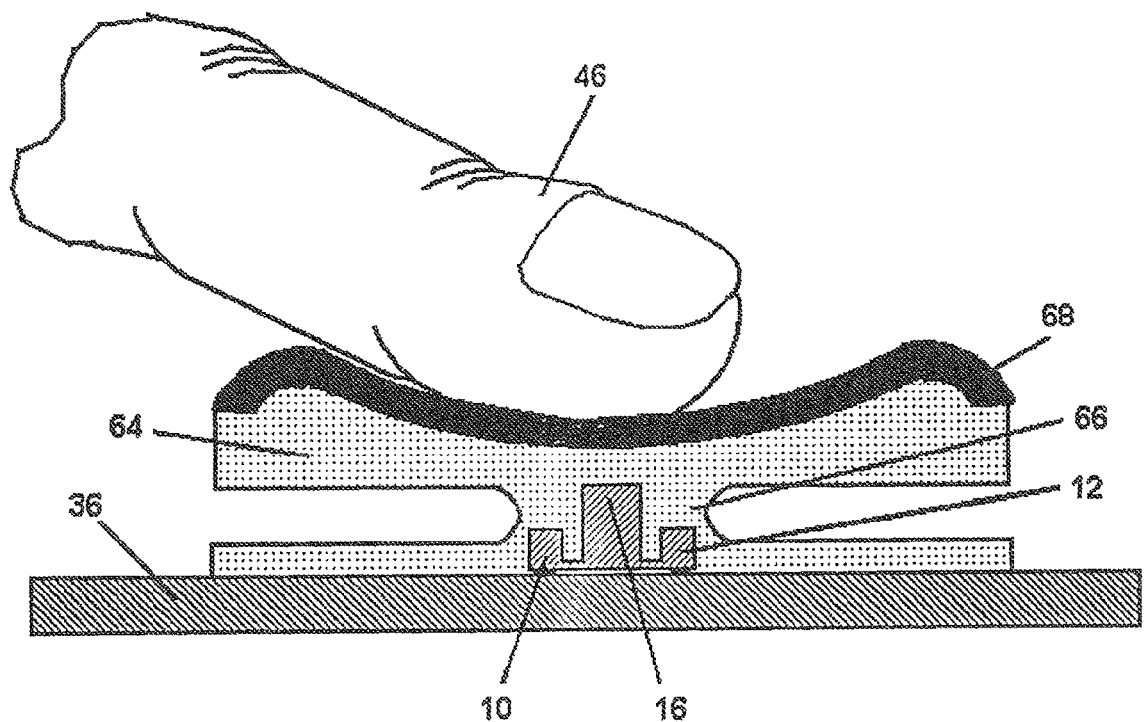
FIG. 8 shows an example of a flexing flat head finger force control device comprised of a rocking elastic plastic button directly coupled to a rigid force-transferring element of a force sensor die and embedded in a layer of plastic, which serves as an integrated button die in accordance with an embodiment of the present invention.

For computer mouse applications at times there is need for small deflections of a button as compared with large joystick applications, but the height of an input control device can be governing. For these applications, as illustrated in FIG. 8, the spring element providing required range of deflection and sensitivity can be made as a low profile rocking two vertebrae spine design according to another embodiment. Here, the sensor die 10 with the rigid force-transferring island 16 is mounted on the substrate 36. The elastic plastic 64 covers all above elements and forms a flexible neck 66. The top surface of the button is covered with a hard layer of plastic 68 serving as a surface where an external force is applied. The force applied, for example by a finger 46, to the top hard layer 68 of the button, rocks the button 64 creating the mechanical stress and deflection within the plastic in the neck area 66 between the sensor die 10 and the rigid force-transferring island 16. This stress is transferred to the sensor die and finally to the stress sensitive IC components.

Figure 9:
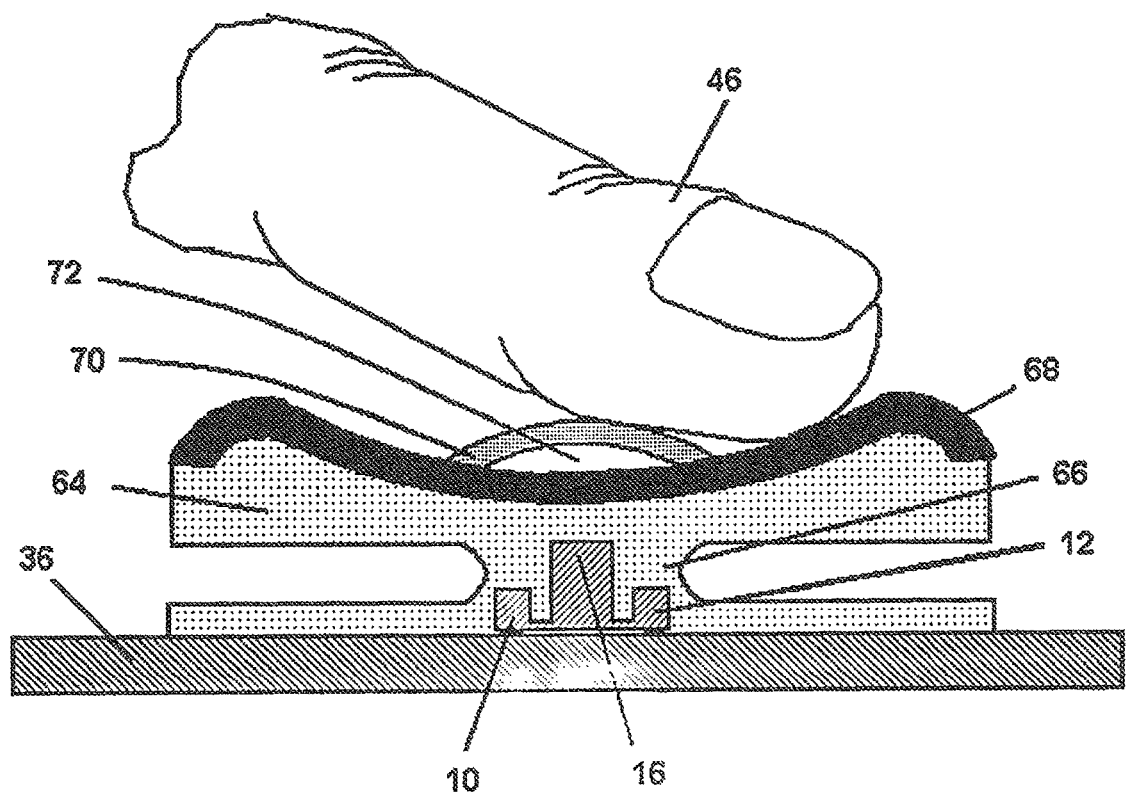
FIG. 9 shows another example of a flexing flat head finger force control device comprised of a rocking elastic plastic button directly coupled to a rigid force-transferring element of a force sensor die and comprising a tactile mechanical feedback on the surface of the button for a tactile sensation mechanical feedback responsive to button depression in accordance with an embodiment of the present invention.

A flexing flat head finger force control device is shown in FIG. 9. It comprises a rocking elastic plastic button 64 directly coupled to a rigid force-transferring island 16 of a force sensor die and comprising a tactile sensation mechanical feedback 70 on the surface of the button 68 allowing sensing the click of the pressed button according to the another embodiment of the present invention.

In the top portion of the plastic button 68 the tactile sensation mechanical feedback 70 allowing sensing the click of the pressed button is incorporated. It has a springy shell structure 70 with the cavity 72 beneath it. When being pressed from the top it reaches the threshold after which it buckles, creating a clicking sensation in the force applying finger 46. This springy shell can be made from different materials including metals and plastics. The clicking action creates not only a tactile feedback but also generates one or more short pulses in the mechanical sensitive components, which can be used as signal for activation of other programmable action.

Figure 10:
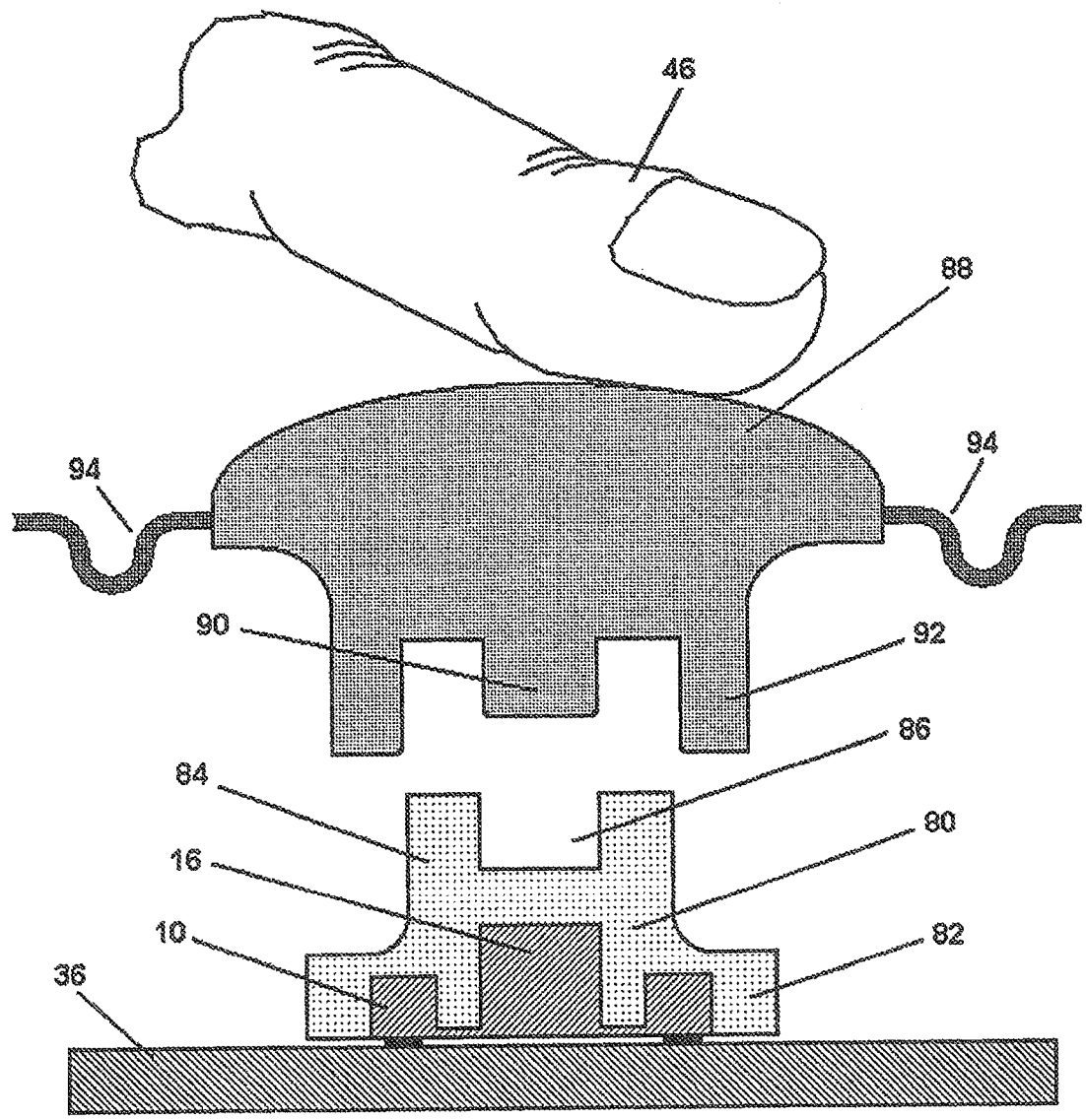
FIG. 10 shows an example of finger force control device based on elastomeric package directly connected to the rigid force-transferring island and comprising connections with different buttons depending with various design die in accordance with an embodiment of the present invention.

Many applications and designs of portable devices require various control buttons in size, shape, color and material while functionality is maintained. In an embodiment of the invention, a detachable button, as illustrated in FIG. 10, can be used.

The finger force control device has an elastomeric package 80 directly connected to the sensor die 10 comprising rigid force-transferring island 16. It also comprises means 84, 86 for connecting with different buttons 88. These buttons also have corresponding and matching means 90, 92 for connecting with control device package 80. The external design of the button 88 depends on specific application requirements. The button 88 can be either a separate component or can be integrated in the mat 94 of the keyboard of portable device.

In some applications, the small surface size of the rigid island pin might not provide a long-term strong adhesion between the pin and the plastic material of the button attached. An increased surface of the rigid pin can be achieved by fabricating an additional force-transferring element 35, as it shown in FIG. 11 according to another embodiment of the present invention. This force-transferring element may have a hole where rigid pin can be inserted and mechanically connected to the pin with either glue, or solder, or some other attaching mechanism. This force-transferring element can be made from different materials, for example from plastic, metal, semiconductor, ceramic, etc. It also can be connected and bonded to the pin in a batch fabrication manner, for example to the whole wafer or to a number of wafers at the same time.

Figure 11:
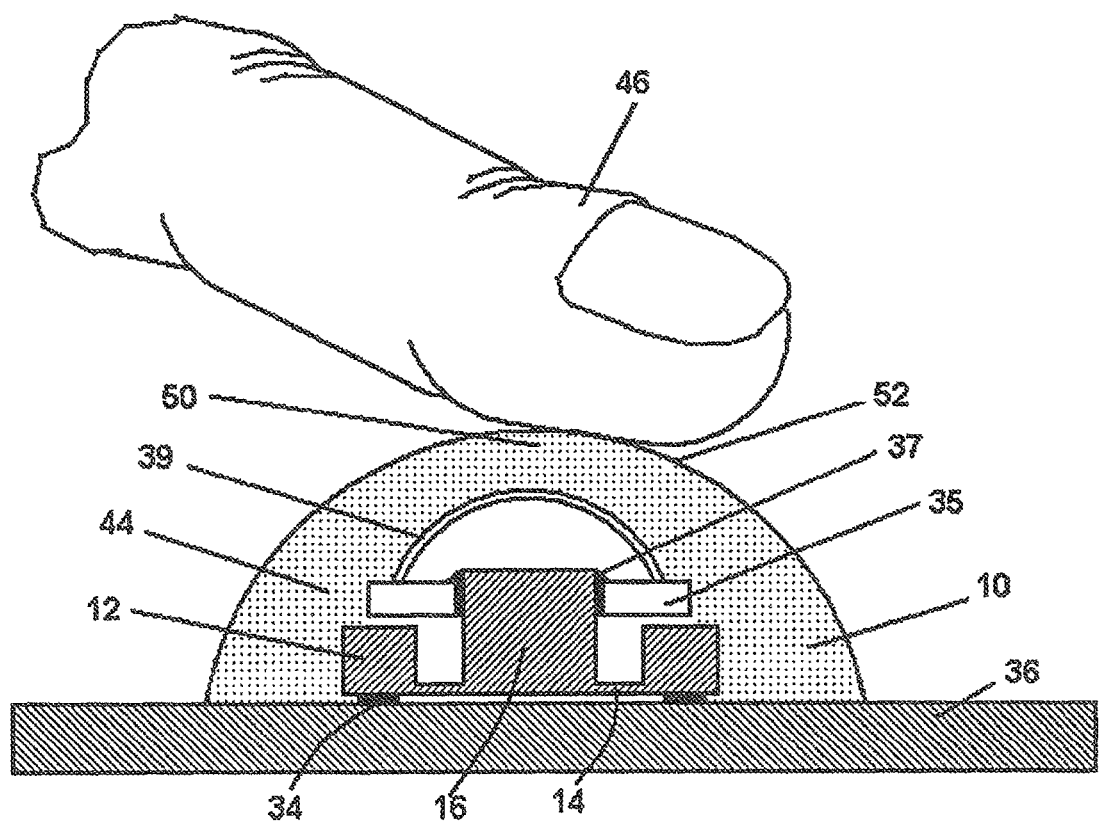
FIG. 11 shows an example of a flat finger force control device with an additional force-transferring element and a springy shell for sensing the click of a depressed button in accordance with an embodiment of the present invention.

An additional force-transferring element 35 can serve, as a platform for mounting a springy shell 39, as shown in FIG. 11. This springy shell 39 can be mounted on the surface of force-transferring element either individually with automated pick and place equipment or in a batch fabrication manner.

There are different designs. One is that a substrate, with the additional force-transferring elements, is bonded to the wafer of force sensor dice and then with the substrate of the springy shells. Another design is substrate with the additional force-transferring elements bonded first to the substrate of the springy shells and then to the wafer with the force sensor dice. The sensor die, the additional force-transferring element and the springy shell, after singulation from the wafer, are covered with plastic material 44, as shown in FIG. 11, forming an external force-transferring element for contact with an external force, e.g., a finger 46.

Figure 12:
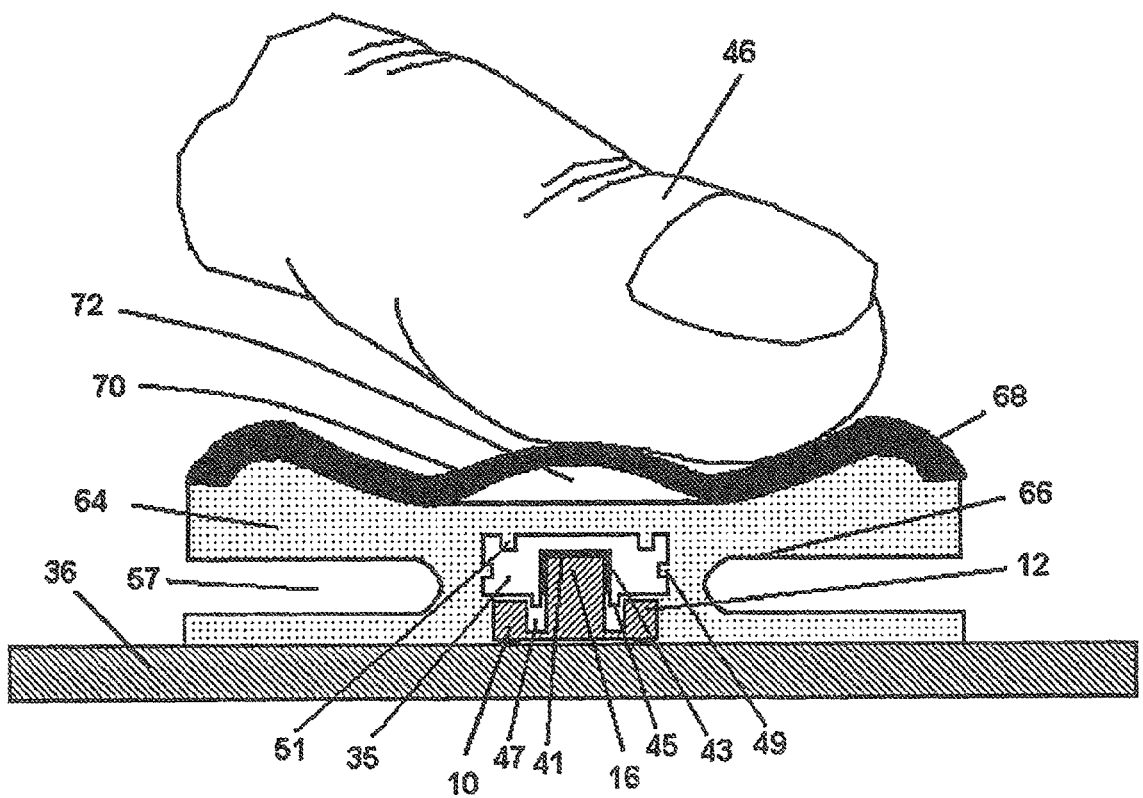
FIG. 12 shows another example of a flexing flat head finger force control device comprised of a rocking elastic plastic button directly coupled to an additional force-transferring element having increased bonding force to the plastic button and comprising a tactile mechanical feedback on the surface of the button for a tactile mechanical feedback responsive to button depression in accordance with an embodiment of the present invention.
Figure 13:
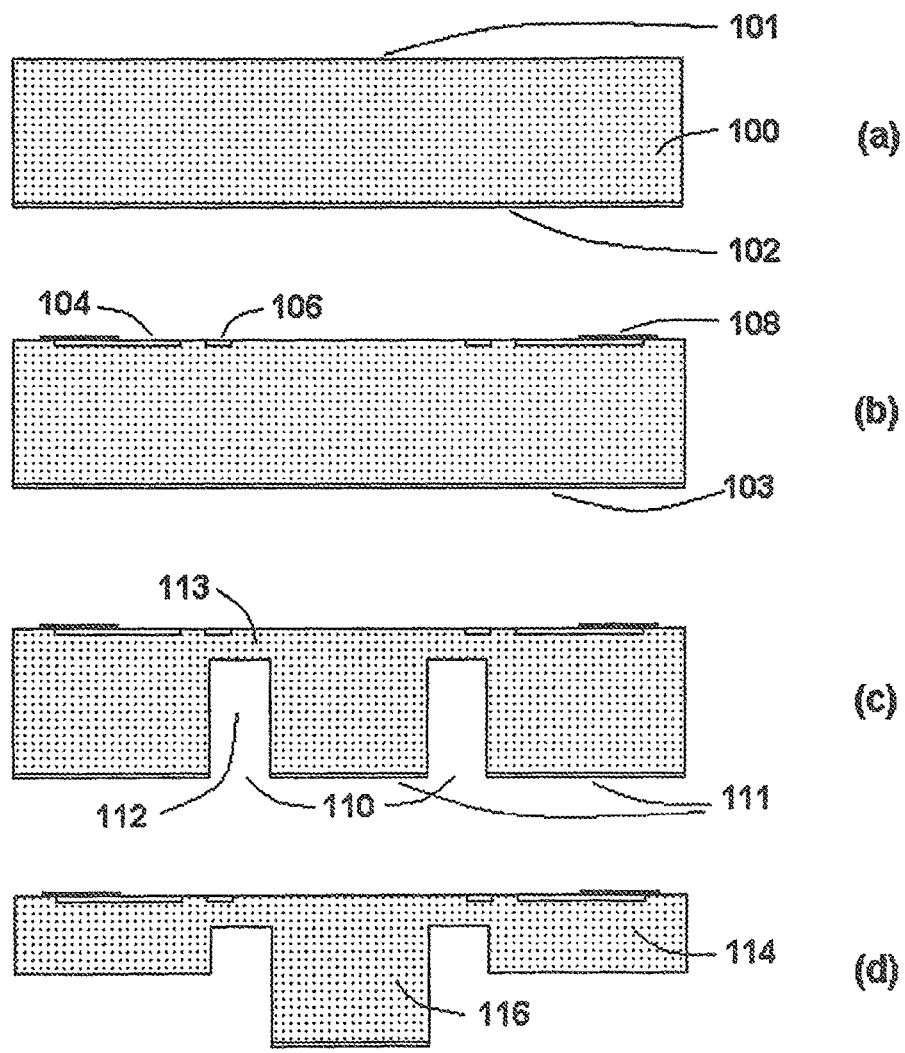
FIG. 13 shows an example of a fabrication process based on the local etching of the diaphragm first and then thinning the die frame in accordance with an embodiment of the present invention.

An additional force-transferring element 35, shown in FIG. 12, can be more complex in shape according to another embodiment of the present invention. This force-transferring element also can be made from a variety of materials, including plastic, metal, semiconductor, ceramic, etc. It also can be connected and bonded to the pin in a batch fabrication manner at the wafer level.

In another embodiment, an additional force-transferring element 35 has a cavity 41 for accepting the rigid pin 16, which are bonded with adhesive material 43. There is a portion 45 which is inserted into the trench 47 proximate to the rigid pin 16 and serves several purposes. First, it increases the surface of connection with the pin and strengthens bonding and reliability of the device. Second, it prevents plastic 64 from going into the trench 47 during molding of the external force-transferring element. Third, it serves, as an additional stop, limiting mechanical overload in X, Y and Z directions.

The additional force-transferring element 35 has cavities or bumps 49, 51 on the surface of this element for stronger bonding with plastic material 64 of the external force-transferring element. It provides higher reliability.

Fabrication of a 3D force sensor die from a single substrate and for the lowest cost represents the biggest challenge. There are several options in batch fabricating sensor dice.

FIG. 13a-13d illustrate the fabrication according to the another embodiment of the present invention. FIG. 13a shows an initial silicon substrate 100 having surface one 101 and surface two 102. The wafer initially goes through the standard CMOS process fabricating IC circuitry 104, sensitive components 106 and contact pads 108, as it shown in FIG. 13b. After a standard CMOS process, a masking layer 103 is deposited on the side two of the wafer. A double-side lithography is made from the side two of the wafer opening the elastic element area 110, leaving the masking layer 111 on the frame and the rigid island, as shown in FIG. 13c. Next a deep local etching of silicon wafer is applied from the backside of the wafer forming the trench 112 to the depth for design dimensions the elastic element 113. Local etching can be done by different types of dry or wet etching known in the art, for example by RIE, dry plasma etching, electro-sparking, wet isotropic and anisotropic etching, etc. After that silicon is removed locally from the frame elements 114 backside of the wafer, as it shown in FIG. 13d. As a result, the height dimension of the rigid islands 116 becomes larger than the remaining thickness if the frame 114 minus thickness of the elastic element 113. The last step of removing silicon from the frame area can be done by different ways including mechanical milling, electro-sparking, abrasive milling and different kind of etching, dry and wet.

Figure 14:
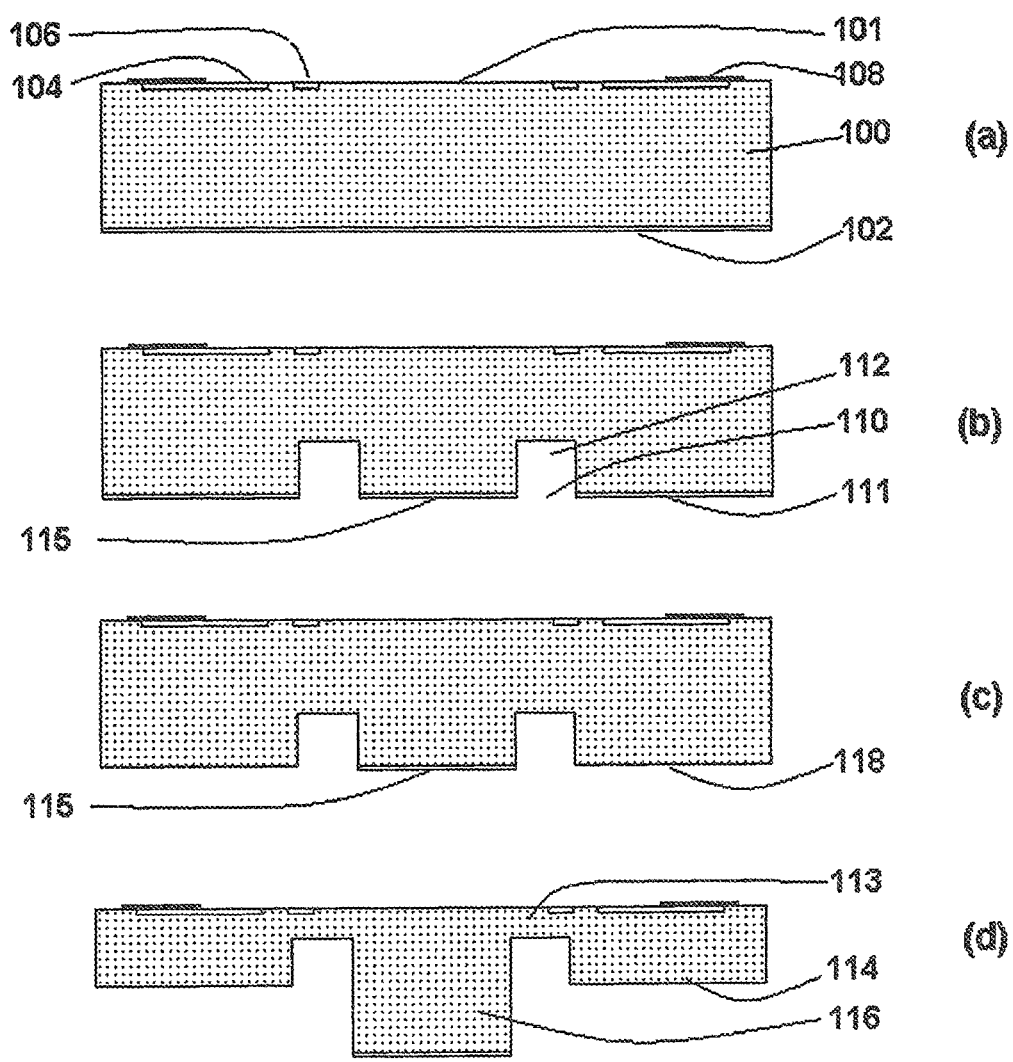
FIG. 14 shows an example of a fabrication process based on the local etching of the diaphragm to a certain depth, and then thinning the die frame and continuing etching the diaphragm at the same time in accordance with an embodiment of the present invention.

FIG. 14a-14d illustrates a fabrication method according to another embodiment of the present invention. FIG. 14a shows an initial silicon substrate 100 having front surface (side one) 101 and back surface (side two) 102. The wafer first goes through the standard CMOS process fabricating IC circuitry 104, sensitive components 106 and contact pads 108, as it shown in FIG. 14a. After a standard CMOS process, a masking layer 111 is deposited on the backside of the wafer. A double-side lithography is made from the backside of the wafer opening the elastic element 110 and leaving the masking layer 111 on the frame and 115 on the rigid island, as shown in FIG. 14b. Next a deep local etching of silicon wafer is made from the backside of the wafer forming the trench 112 to the depth equal to the difference between the final thickness of the frame and design thickness of the elastic element 113. This local etching can be done by different types of dry or wet etching known in the art, RIE, dry plasma etching, electro-sparking, wet isotropic, anisotropic etching, etc. Next that masking layer 111 is removed from the frame element 118, as shown in the FIG. 14c. The etching process from the backside of the wafer continues etching elastic element and frame element simultaneously, shown in FIG. 14d. As a result, the height dimension of the rigid island 116 becomes larger than the remaining thickness of the frame 114 minus thickness of the elastic element 113 and the thickness of the elastic element reaches design thickness. The step of removing silicon from the elastic element and frame element can be done in various ways including different kind of etching, dry and wet, for example by ME.

Figure 15:
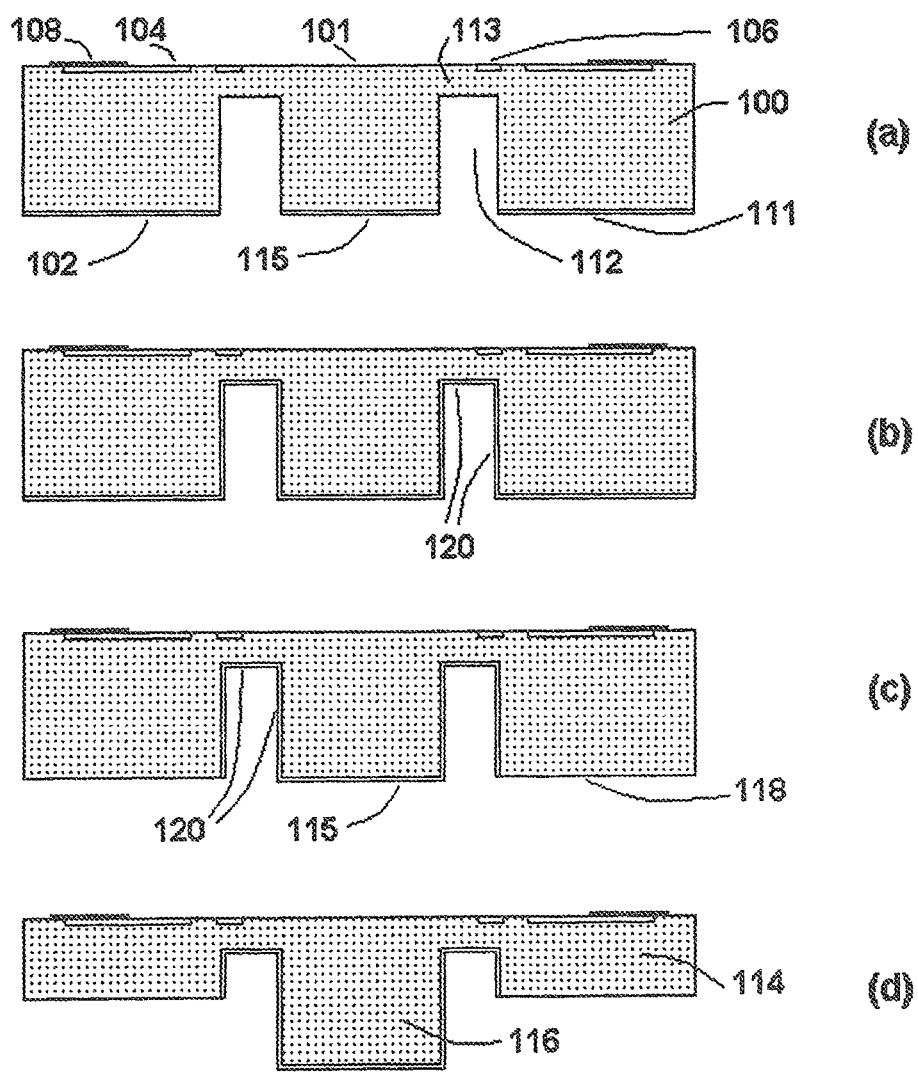
FIG. 15 shows an example of a fabrication process based on the local etching of the diaphragm first, then depositing a mask layer on the diaphragm area and then thinning the frame by etching die in accordance with an embodiment of the present invention.

FIG. 15a-15d illustrate the fabrication method according to yet another embodiment of the present invention. FIG. 15a shows a silicon substrate 100 having front surface 101 and back surface 102 after a CMOS process was completed and the trenches 112 around rigid island 116 were etched forming an elastic element 113. After that a masking layer 120 is deposited on the backside of the wafer masking the sidewalls of the trenches and the surface of the elastic element 113, as it shown in FIG. 15b. The next step is removing a masking layer from the frame area 118, as shown in FIG. 15c leaving the mask 115 and 120 on the rigid island and trench including back surface of the elastic element 113. Next the silicon is removed locally from the frame areas from the backside of the wafer, as it shown in FIG. 15d. As a result, the height dimension of the rigid islands 116 becomes larger than the remaining thickness if the frame 114 minus thickness of the elastic element 113. The last step of removing silicon from the frame area can be done in a variety of ways including different kind of etching, dry and wet.

One of the challenges in methods described above is removing mask from the frame element, when some kind of profile is already fabricated on the backside of the wafer. This can be achieved by masking the backside of the wafer by two layers of masking materials having etching selectivity to each other and two lithographic processes made on the initial flat surface of the wafer backside according to another embodiment of the present invention.

Figure 16:
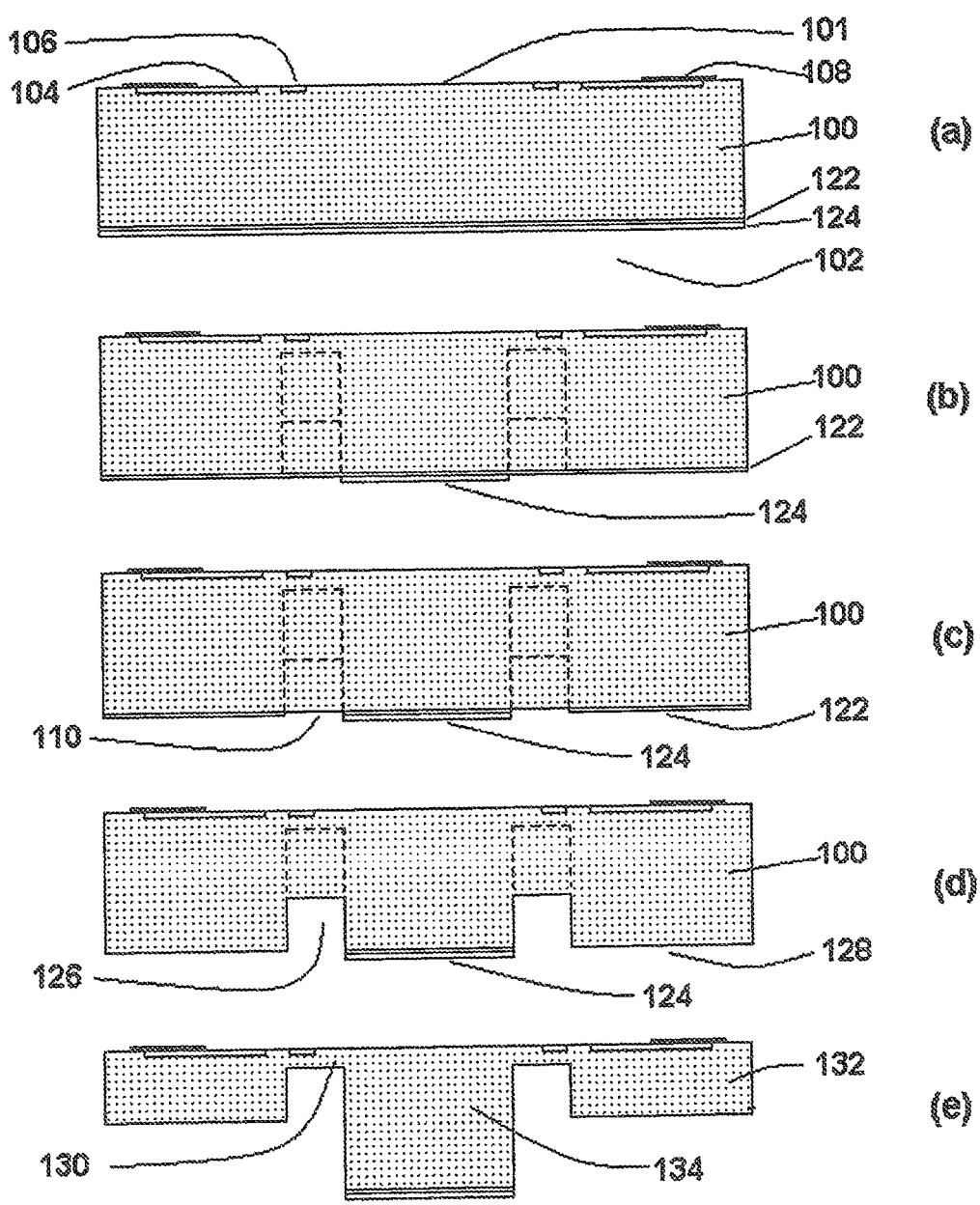
FIG. 16 shows an example of a fabrication process based on deposition of two layers of masking materials and two lithographic processes allowing etching a step profile fabricating the diaphragm area and thinning the frame in accordance with an embodiment of the present invention.

FIGS. 16a-16e a shows a silicon substrate 100 having front surface 101 and back surface 102 after CMOS process. Next two masking layers 122 and 124 are deposited on the backside of the wafer, as it shown in FIG. 16a. The masking layer 124 adds high selectivity of etching to masking layer 122. The next step is removing the masking layer 124 from the frame element and elastic element leaving it only on the rigid islands, as shown in FIG. 16b. A second lithography follows, opening the elastic element 110 in the masking layer 122, as shown in the FIG. 16c. As a result, the backside of the wafer has three different etched elements: unmasked area 110, frame element masked with one masking layer 122 and rigid island element masked with masking layers 122 and 124. Next the silicon is etched locally in the elastic element through the masks 122 and 124 to a predetermined depth. Following that the masking layer 122 is etched from the frame element 128 leaving the mask 124 on the rigid island, as shown in FIG. 16d. The next step is a simultaneous etching of the frame and the elastic elements, as shown in FIG. 16e. As a result, the height dimension of the rigid islands 134 becomes larger than the remaining thickness of the frame 132 minus thickness of the elastic element 130 and protrude outward from the substrate.

Figure 17:
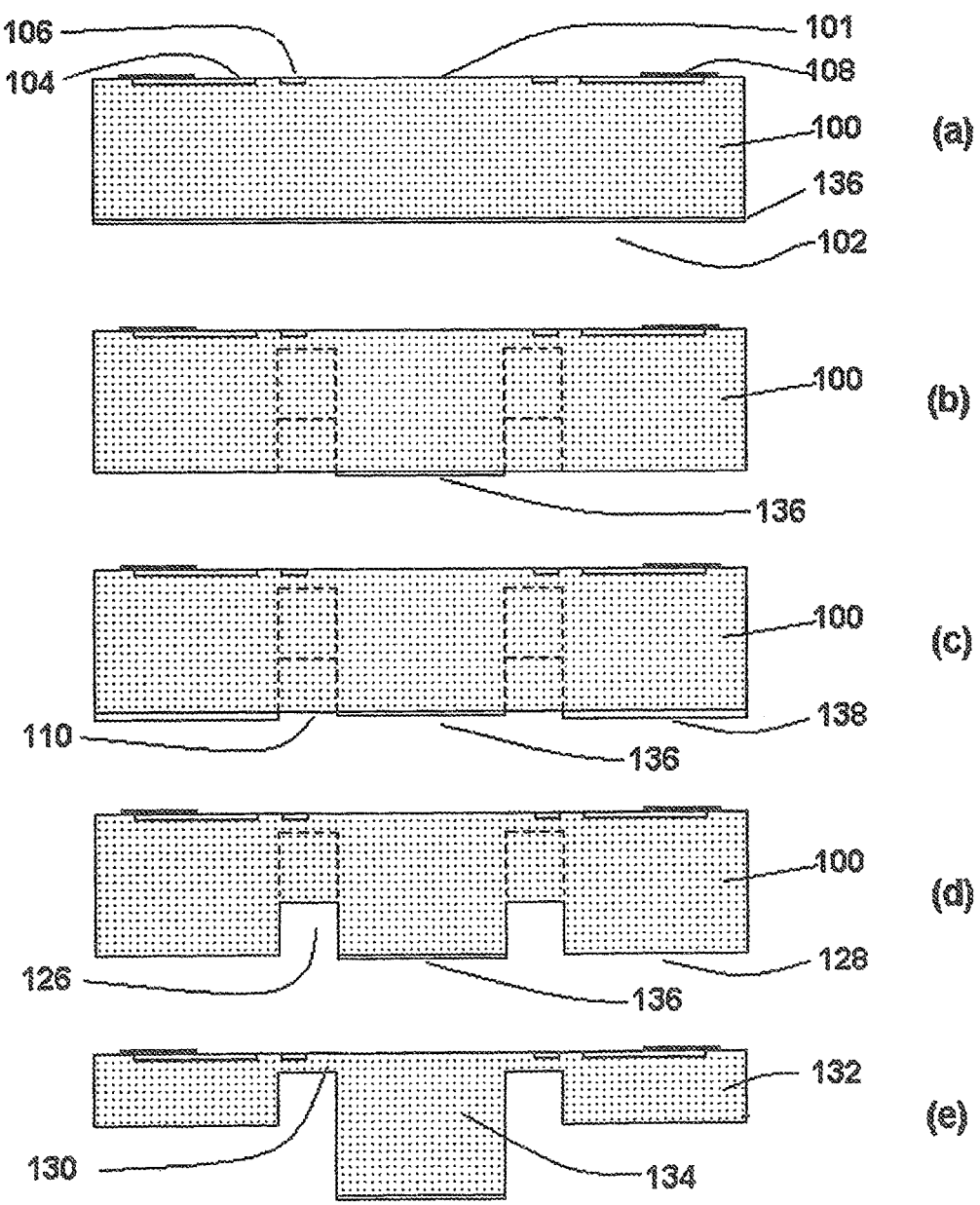
FIG. 17 shows an example of a fabrication process based on deposition of one layer of masking material and two lithographic processes allowing etching a step profile fabricating the diaphragm area and thinning the frame die in accordance with an embodiment of the present invention.

Another process of a double masking process from the backside of the wafer is presented in FIGS. 17a-17e according to another embodiment of the present invention. FIG. 17a shows a silicon substrate 100 having front surface 101 and back surface 102 after CMOS process. Next a masking layers 136 is deposited on the backside of the wafer 102, shown in FIG. 17a. The next step is removing a masking layer 136 from the frame and from the elastic element leaving the layer only on the rigid islands, shown in FIG. 17b. A second lithography follows, opening the elastic element 110, as shown in the FIG. 17c. As a result, the backside of the wafer has three different areas: unmasked area 110, frame element masked with photoresist layer 138 and rigid island element masked with masking layer 136. On the next step silicon is etched locally in the elastic element area through the masks 136 and 138 to a predetermined depth. Next the masking photoresist layer 138 is etched off the frame 128 leaving the mask 136 on the rigid island, as shown in FIG. 17d. The final step is a simultaneous etching of the frame and the elastic element, shown in FIG. 17e. As a result, the height dimension of the rigid islands 134 becomes larger than the remaining thickness of the frame 132 minus thickness of the elastic element 130.

The deep etching of the trenches surrounding the rigid islands also etches a substantial part of the wafer thickness, and this process can also be useful for the purpose of singulating the dice from the wafer without conventional dicing, reducing the overall cost of the device in accordance with another embodiment of the present invention.

Figure 18:
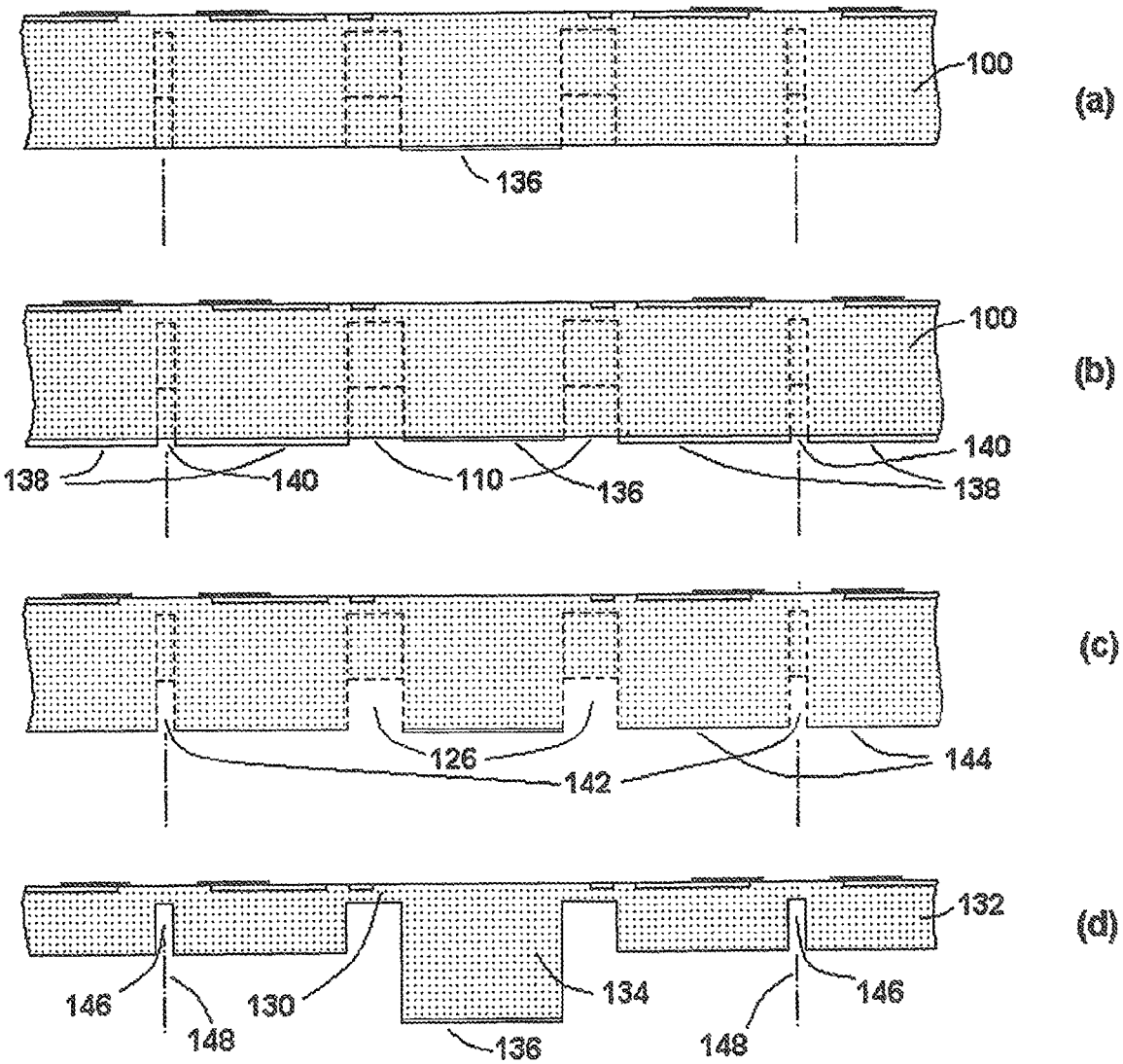
FIG. 18 shows an example of a fabrication process based on deposition of one layer of masking material and two lithographic processes allowing etching an elastic element, separating trenches for dicing and thinning the frame at the same time in accordance with an embodiment of the present invention.

FIG. 18a shows a silicon substrate 100 after CMOS process with the substrate backside of the wafer masked in the rigid islands with the masking layer 136. The second lithography is following up opening the elastic element 110 and dicing trenches 140, as shown in the FIG. 18b. As a result, the backside of the wafer has four different areas: unmasked elastic element area 110, unmasked dicing trenches 140, frame masked with photoresist layer 138 and rigid island masked with masking layer 136. On the next step silicon is etched locally in the elastic element 126 and in the dicing trenches 142 through the masks 136 and 138 to a predetermined depth. Next the masking photoresist layer 138 is etched from the frame area 144 leaving the mask 136 on the rigid island, as shown in FIG. 18c. A simultaneous etching of the frame, the elastic elements and dicing trenches occurs, shown in FIG. 18d. As a result, the height dimension of the rigid islands 134 becomes protruded from the substrate, over the remaining thickness of the frame 132. This occurs simultaneously with the formation of the dicing trenches 146 for singulation of the dice from the wafer.

Figure 19:
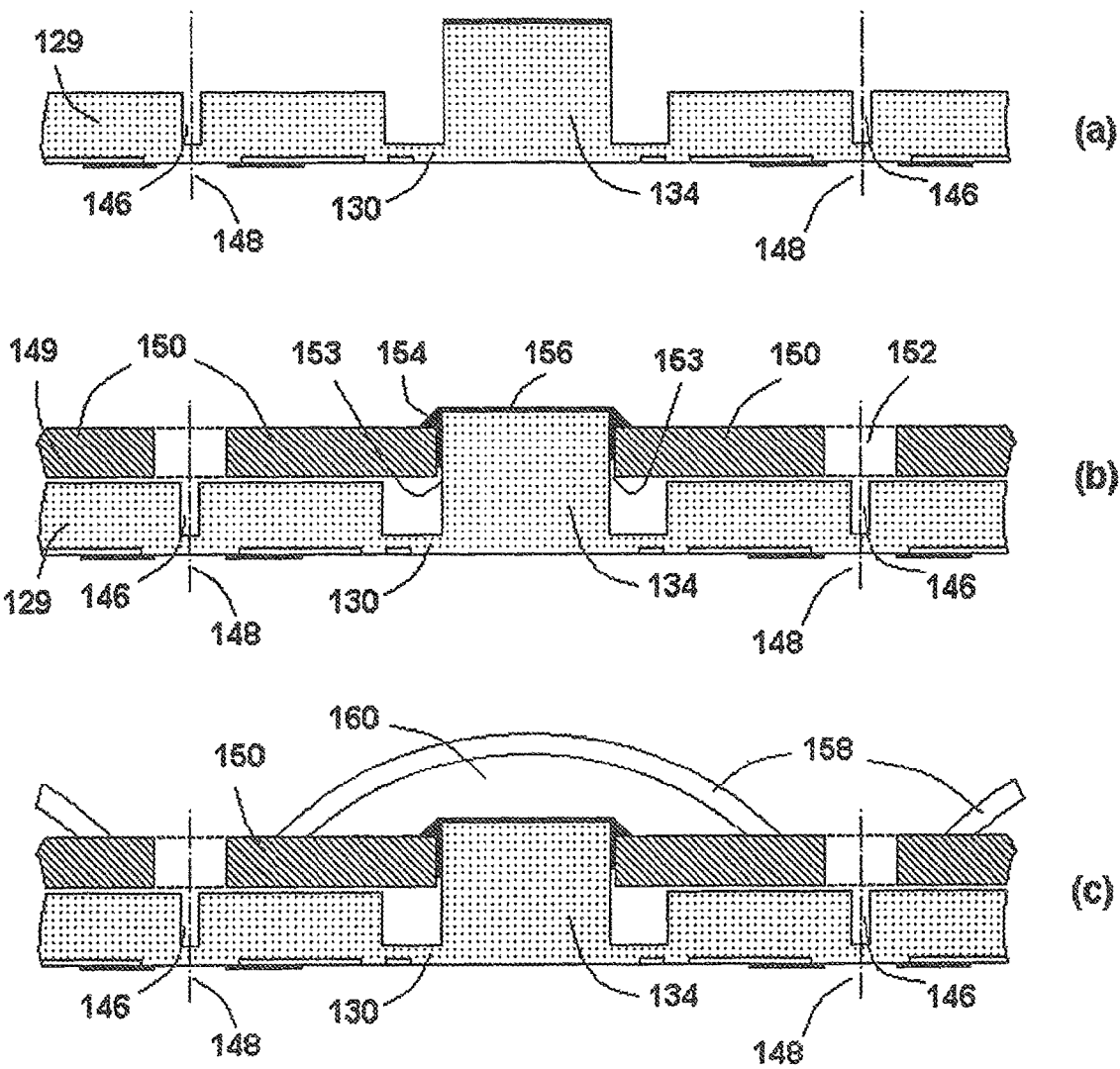
FIG. 19 illustrates additional steps in fabrication of an alternate larger surface for force-transferring element, for providing stronger adhesion between the pin and the plastic material on the top of the die, in accordance with the another embodiment of the invention.

FIG. 19 illustrates additional steps in fabrication process, according to another embodiment. These steps allow fabricating an additional force-transferring element 150, as it shown in the FIG. 19. This force-transferring element has much larger surface as compared to the surface of the rigid pin 134. It provides a long-term strong adhesion between the pin and the plastic material on the top of the die.

FIG. 19a shows the completed sensor wafer with the rigid pins protruding from the surface of the substrate wafer. The mechanical substrate wafer 149 is then aligned with the sensor wafer 129 so that pins 134 go through the coupling holes 153 in the substrate 149. Then two wafers are bonded together with material 154, 156. This material can be adhesives, solder, or other material creating strong and rigid bonding between two wafers. The individual elements 150 might be separated from each other at the wafer level by the combination of slots and bridges 152, as it shown in FIG. 19b. These slots and bridges are fabricated in the substrate, as holes for the pins are fabricated for mating. At this point the bonded wafers can be diced and application of plastic material on the top of the die for forming external force-transferring element can proceed.

As a continuation of this embodiment, FIG. 19c illustrates additional steps in fabrication process. These steps include mounting springy shells 158, as shown in FIG. 19c. These springy shells 158 can be mounted on the surface of force-transferring elements 150 either individually with automated pick and place equipment or in a batch fabrication manner. Next the bonded wafers with springy shells can be diced and/or application of plastic material on the top of the die for forming external force-transferring elements in a batch process.

Figure 20:
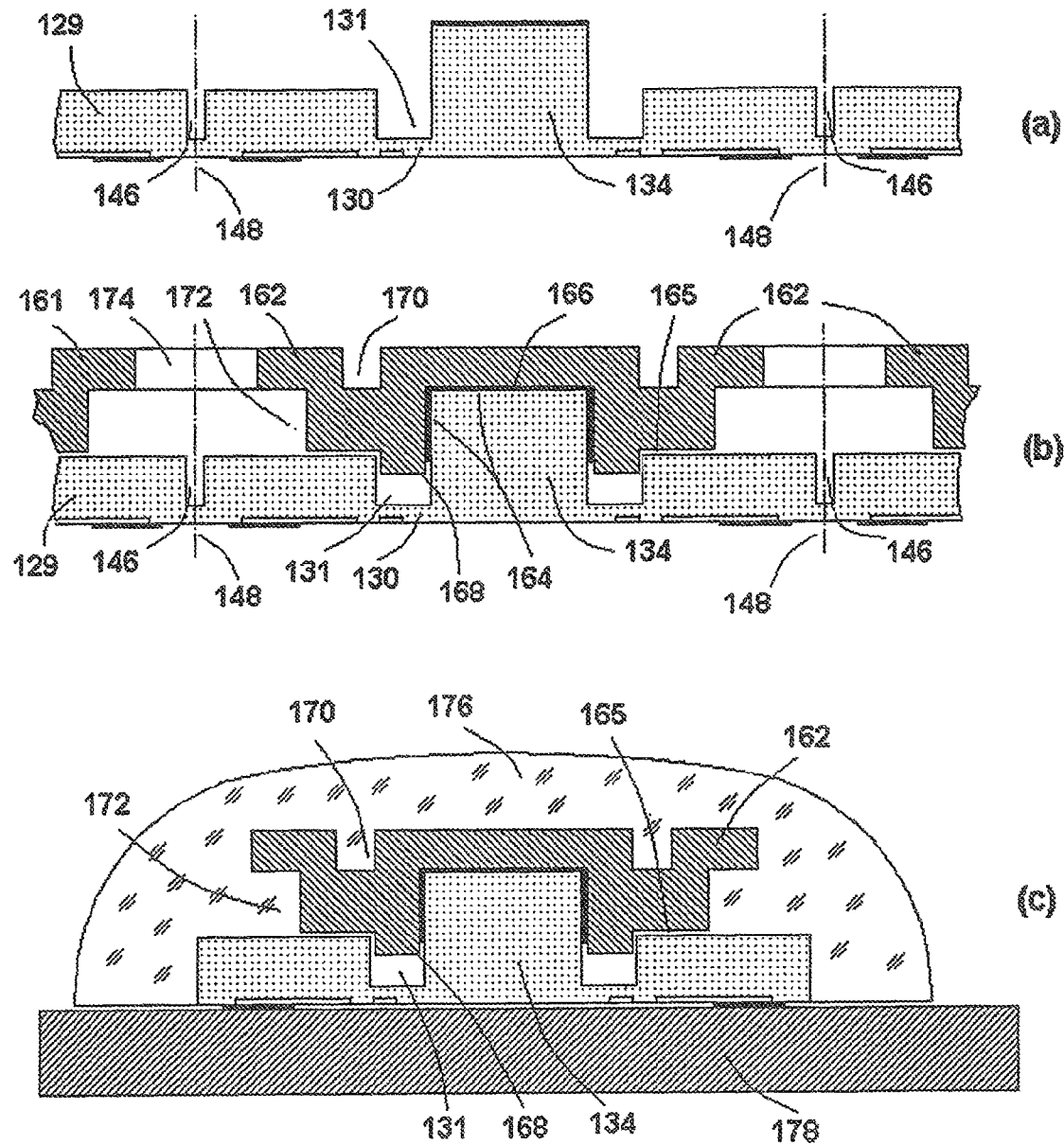
FIG. 20 illustrates another additional steps in fabrication of an alternate larger surface for force-transferring element, for providing stronger adhesion between the pin and the plastic material on the top of the die and providing additional force overload protection, in accordance with the another embodiment of the invention.

FIG. 20 illustrates the back-end of fabrication process according to another embodiment of the invention. FIG. 20a shows the completed sensor wafer with the rigid pins protruding from the surface of the wafer. The mechanical substrate or wafer 161 is provided. This mechanical substrate can be made from different materials, for example from plastic, metal, semiconductor, ceramic, etc. At least one surface of this mechanical substrate has been profiled in such a way that the cavities 166 for accepting the rigid pins 134 are formed. The other micro-structural elements such as ridges 168, cavities 172 and cavities or trenches 170 along with the other designed micro-structural elements could be fabricated at the same time with the cavities 166 for the pins 134. The mechanical substrate is aligned with the sensor wafer 129 so that pins 134 go into the cavities 166 in the mechanical substrate 161. The depth of the cavity 166, the height of the pin 134 and the thickness of the bonding material 164 all together determine the gap 165 between the frame of the sensor wafer 129 and the additional force-transferring element 162. At the same time ridges 168 go into the closed trench 131 around the pin 164. At the next step two wafers are bonded together with bonding material 164. This material can be either different kind of adhesives or solder, or other material creating strong and rigid bonding between two wafers. The individual elements 162 might be separated from each other at the substrate level by the combination of slots and bridges 174, as it shown in FIG. 20b. These slots and bridges are fabricated in the mechanical substrate at the same time, as the other micro-structural elements 166, 168, 170, 172 are fabricated. At this stage the bonded wafers are diced and then plastic material 176 is applied on the top of the dice in a batch-manufacturing manner for forming external force-transferring elements, as it shown in FIG. 20c. In the process of molding the material 176 the external force-transferring elements this material will go into the cavities 170, 172 creating strong and reliable mechanical connection with the additional force-transferring element 162. At the same time the small gaps 165 and the ridges 168 would prevent plastic material 176 from going into the closed trenches 131 around the pin 134.

Is should be noted, that the fabrication of the devices, according to this invention, on a common substrate carries inherent advantages from integration with other analog and digital circuits, circuits which provide but are not limited to analog signal amplification, analog-to-digital and digital-to-analog conversion, multiplexing, signal processing, gate logic, memory, digital interface, power management, encryption, compression and decompression, mixed signal processing, transmitting and receiving wireless signals, sensing components of other than force physical domains and combinations.

It should be understood that the microstructures of the die, structures of the finger-mice, finger buttons and micro-joysticks and methods of their fabrication do not limit the present invention, but only illustrate some of the various technical solutions covered by this invention. While the invention has been described in detail with reference to preferred embodiments, it is understood that variations and modifications thereof may be made without departing from the true spirit and scope of the invention.

Some embodiments provide three-dimensional force input control devices for sensing vector forces and converting them into electronic signals for processing in an electronic signal processing system with components within a sensor die fabricated from the single semiconductor substrate and in some instances with all components within a sensor die fabricated from the single semiconductor substrate. A device can comprise a sensor die formed within semiconductor substrate, an elastic element within said semiconductor substrate, a frame formed around said elastic element and coupled with at least part of the periphery of said elastic element all within the substrate, at least three mechanical stress sensitive IC components located in the elastic element for providing electrical output signals proportional to the mechanical stress in the location of the IC components, at least one rigid island element formed in the substrate and coupled with the elastic element, this rigid island transfers an external vector force to the elastic element and through the IC components which provide electrical output signal, this rigid island has a height bigger than the thickness of the frame minus thickness of the elastic element, at least one spring element coupling the force-transferring element with an external force and at least one electronic circuit for processing output signals from the mechanical stress sensitive IC components.

The elements can vary in design and material in order to realize different aspects and advantages.

Several methods of fabrication are disclosed, with some methods comprising the steps of providing a semiconductor substrate having a side one and a side two; fabricating stress-sensitive IC components and signal processing IC on side one of the substrate; fabricating closed trenches on side two of the substrate, the trenches forming boundaries defining elastic elements, frame elements, and rigid islands, trenches for die separation, and removing additional substrate material from side two of the substrate in the frame area leaving the dimension of the rigid island protruding outward from side two and larger than the remaining thickness dimension of the frame minus the thickness of elastic element, leaving the rigid island extending outward from the substrate for coupling with external force transferring elements or for receiving external mechanical forces in any and all directions. Removal of part of the substrate from side two frame element can be done by selective etching.

A variation for fabricating closed trenches on side two of the substrate within a die area further comprises depositing protective masking layer on side two of the substrate; photolithographically defining a pattern of the rigid island, elastic element, frame and separating dice trenches, removing masking layer from elastic element and separating dice trenches and etching substrate from side two of the substrate in the elastic element and separating dice trenches areas to a selected thickness such that the closed separating trenches provide the shape and thickness contours in the substrate for separating the die in accordance with the defined pattern using less substrate and producing less waste.

Different types of MEMS devices can be tested using the methods described below. Examples of five embodiments are descried below: pressure sensors, one-axis, two-axis and three-axis force sensors, accelerometers, gyroscopes, switches, actuated mirrors and other types of MEMS devices. These methods can be implemented independently or with two or more in cooperation.

FIGS. 21-29 show various embodiments of methods of electro-mechanical testing of MEMS devices on a wafer utilizing different force actuators, ways of applying force to MEMS devices under test and/or characterization of multi-axis MEMS devices sensitive to components of applied force. Detailed description of the test systems and testing methods according to some embodiments are presented below in the five example embodiments. The present invention is not limited to these five embodiments, and the five embodiments are provided as representations of the inventive aspects of the present invention. Further, features and aspects of the below described embodiments can be interchanged without departing from the present invention. While the invention disclosed below is described by means of specific embodiments and applications thereof, numerous modifications and variations could be made thereto by those skilled in the art without departing from the scope of the invention set forth in the claims.

First Test Embodiment

Figure 21:
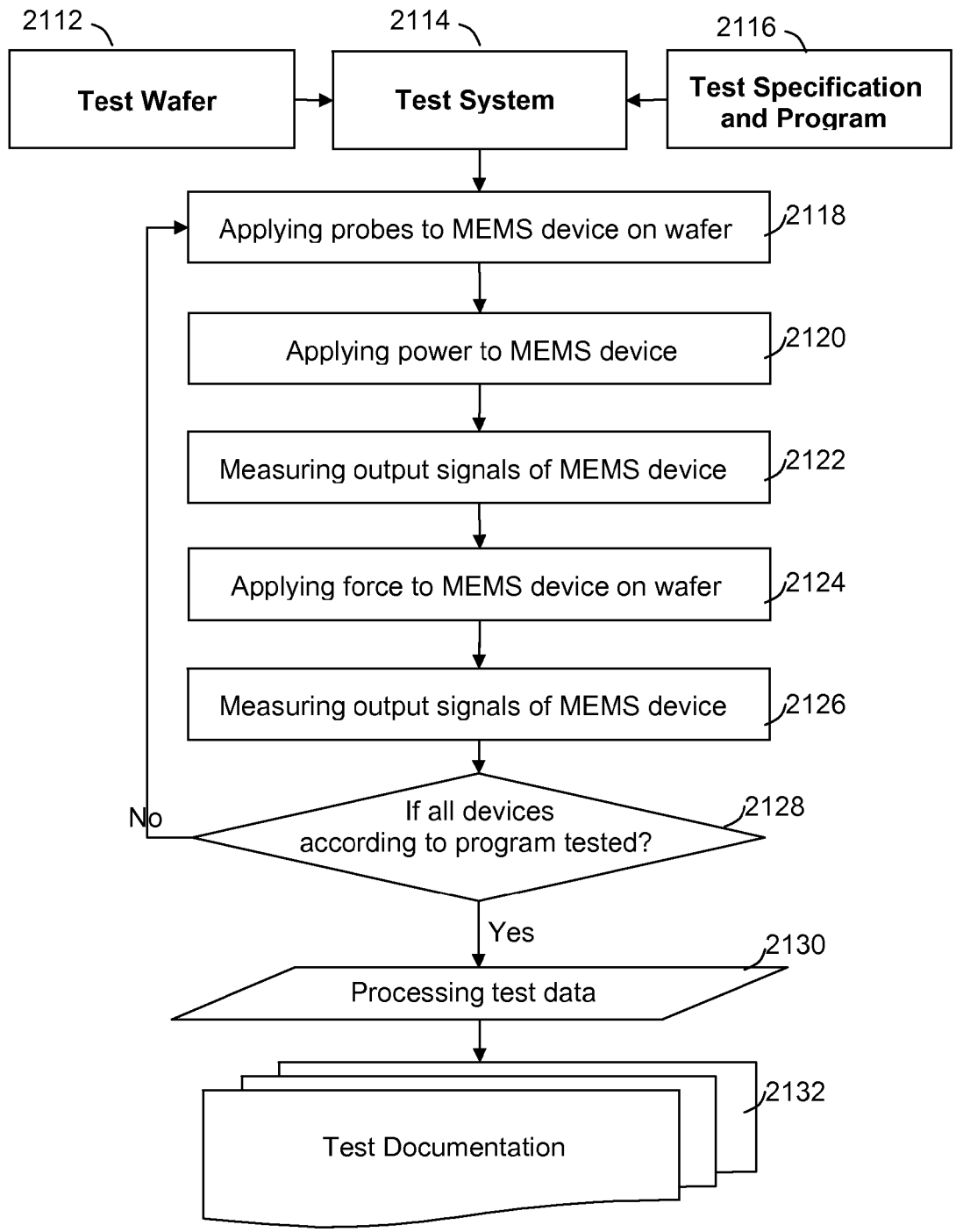
FIG. 21 illustrates an algorithm of electromechanical testing of MEMS devices on a wafer according to some embodiments.

FIG. 21 illustrates method of electromechanical testing of MEMS devices on wafer level according to a first embodiment. A wafer 2112 with MEMS devices for testing, a test system 2114 for electromechanical testing of these MEMS devices on wafer level, a test program and/or a specification 2116 are provided initially.

Figure 24:
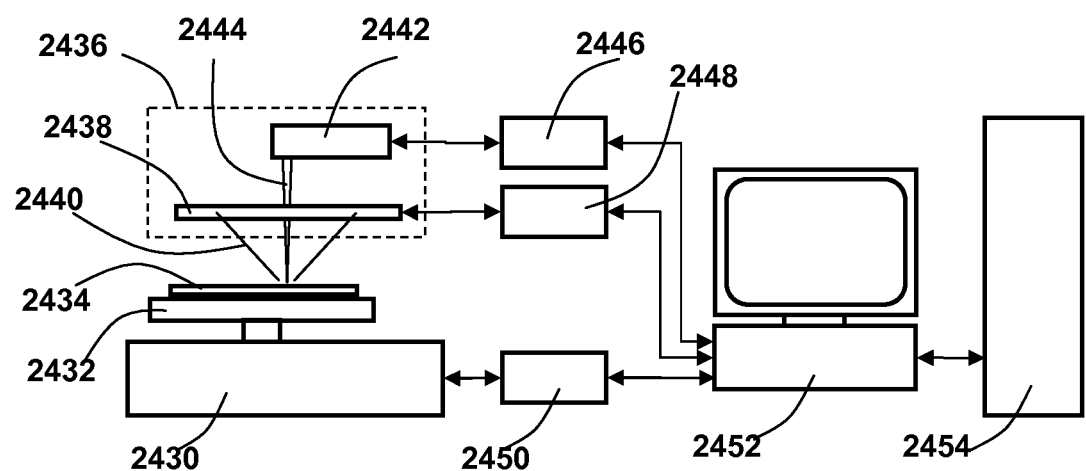
FIG. 24 illustrates a block diagram of the test system, configured to electromechanically test of MEMS devices on wafer according to some embodiments.

Block diagram of a test system 2410, according to some embodiments, configured for electromechanical testing of MEMS devices on wafer level is shown in FIG. 24. It includes a wafer holder or chuck 2432 with X-Y table 2430; a probe card 2438 with probes 2440 for providing electrical contacts to at least one MEMS device; a data acquisition system 2448 and a data processing and control system 2452 for measurements, data processing and test flow control. In many cases, the data processing and control system can be based on a computer 2452 with means for interacting with an operator (keyboard, display, alarm, etc.). Data acquisition system can, in some embodiments, be built either as a block or board inside the data processing system 2452 or as a stand-alone block or board 2448. The test system also has at least some components of an actuator 2442, 2444 for applying force to at least one MEMS device. The data processing and control system 2452 controls motion of X-Y table through chuck control block 2450, controls actuator 2442 through actuator control block 2446 and manages data coming through data acquisition system 2448. The data processing and control system 2452 also can be connected to either a server or data storage 2454 for saving the test data, retrieving specs and test protocols, statistical data for products, etc. If necessary, such connection can be made through a network including the Internet.

Different actuators can be used in the test system for applying force to at least one testing MEMS device at a time, including a mechanical actuator, a magnetic actuator, an electromagnetic actuator, an electrostatic actuator, a thermal actuator, a piezoelectric actuator, or combinations thereof. Other types of actuators also can be used.

A test specification and a test program are available for the test. These documents can be loaded to the computer 2452 either from its local storage device or from external device 2454 or from a network, including the Internet. In some embodiments, the test program and/or test specification comprise in particular: a wafer map; a number of dice to be tested and their position on the wafer map; conditions and sequence of testing and acceptable ranges of parameters.

The test routine, in some implementations, includes loading a MEMS wafer for testing on wafer holder or chuck and registering the wafer within X-Y coordinate system of X-Y table. This defines both proper angular orientation of the wafer and coordinates of dice in this coordinate system. Z coordinate of the wafer surface relative to the probes is determined during the loading step as well.

The next step 2118 (see FIG. 21) is selecting a group of MEMS devices for testing according to the test program, aligning electrical probes of the probe card to the contact pads located on the devices selected for testing and applying the probes to this group of devices. The selected group consists of at least one MEMS device. In some cases probes can contact multiple MEMS devices at the same time, and in some instances testing of these devices can be done without moving wafer or changing position of the probes.

In step 2120, power is provided to at least one MEMS device, and in step 2122 a first set of electrical output signals of the testing MEMS device are measured. These signals represent output of testing MEMS device without applied force.

At the next step 2124 a force is applied to at least one testing MEMS device under testing using the force actuator. The applied force causes change of the output signals with respect to the initial measurement made without applied force. In step 2126, a second set of output signals of the MEMS devices are measured with applied force.

Different approaches can be used to apply force to the MEMS device. One approach includes moving a part of the force actuator toward the MEMS device under test and establishing a mechanical contact between a part of the actuator and a part of MEMS device. The contact can be made with different parts of the MEMS device, including a diaphragm, a cantilever, a pin, a beam, a proof mass, a bottom or side walls of a cavity, side walls of an opening, a suspended member and other parts of MEMS device. A force can be applied to the MEMS structure after the contact is made.

Another approach is related to applying force without making a mechanical contact with the MEMS device. In particular, this can be done with help of either a magnetic field or electrical field. In one embodiment, MEMS devices can have a layer of ferromagnetic material responsive to an external magnetic field. Therefore, by creating a magnetic field in the volume where the MEMS device is located it is possible to apply a force to the device. The force acting on the MEMS device can be changed by changing magnitude and/or direction of the magnetic field. In another embodiment a MEMS device has a conductor. By creating a magnetic field in the volume where the device under test is located and passing a current through the conductor it is possible to load the MEMS device with a Lorentz force. Magnitude and direction of the force can be changed by changing the direction and the magnitude of the current as well as by changing magnitude and direction of the magnetic field. The source of magnetic field can be a permanent magnet, an electromagnet, a coil and a conductor carrying a current.

The force can be applied to one MEMS device, to a group of MEMS devices or to all MEMS devices on the wafer. It can be applied from the top side facing the probes or from the back side facing the chuck. The force can be applied in the form of magnetic force, electromagnetic force, electrostatic force, contact force, pressure, acoustic pressure, vibration, shock, pneumatic pressure and/or other forces, or combination of these actions.

The force can be applied to test structures provided on MEMS wafer for characterization of MEMS devices. Alternatively, actual mechanical structures of MEMS devices can be tested. The force can be applied to testing MEMS device after relative motion of testing MEMS device and at least one tangible component of the force actuator toward each other. For example, a mechanical probe or a source of magnetic field can be moved toward the MEMS device under test. The at least one tangible component of the force actuator and the MEMS device under tests can move toward each other when electrical probes are applied to the MEMS device under test. This can be done, for example, by integrating on a probe card a portion of the force actuator providing a mechanical contact with the MEMS device under test and/or by integrating a source of magnetic field or electrical field with the probe card. The source of the magnetic field, for example, can cause motion of the parts not mechanically connected with the probe card resulting in application of a force to the MEMS device under test. The force actuator can be activated before moving the at least one tangible component toward the testing MEMS device, during motion or after moving at least one tangible component of force actuator toward the testing MEMS device. The tangible component of the force actuator can be a probe, a needle, a pin, a wire, a spring, a spring-loaded member, a rod, a ring, a rubber or polymer-made soft member, a micro-gripper, a ball, a piston, a permanent magnet, an electromagnet, a coil, a solenoid, a conductor, a plate, a diaphragm, a bimorph beam, a bimetallic beam, a piezoelectric beam, a fixture, a pneumatic nozzle or combination of the above.

A set of one or more locations and/or areas where force is to be applied to one or more MEMS devices, magnitude and direction of the applied force and/or other such parameters are referred to later as a test condition. For example, if during testing, the force is applied to the testing MEMS device under test in two different locations it corresponds to two test conditions. If the force of two different magnitudes or directions is applied at the same point it also corresponds to two different test conditions. Using multiple test conditions in wafer-level testing is helpful in testing of multi-axis MEMS devices that contain multiple sensitive components.

Applying force to a MEMS device with two or more sensitive axes using at least two different test conditions (i.e. at least two locations and/or at least two different directions, etc.) can result in getting linearly independent signals from sensitive components of the tested MEMS device. The test data containing these linearly independent signals can be used in solving a system of equations with respect to sensitivities of the MEMS device corresponding to the two sensitive axes. In at least some instances, these equations are reflecting the interdependence of output signals from each sensitive component on applied vector force, sensitivity of corresponding sensitive component, zero force output signals and temperature.

Similarly, applying force to a MEMS device with three sensitive axes using at least three different test conditions can result in getting linearly independent signals from sensitive components. These linearly independent signals can be used in solving a system of equations with respect to sensitivities of the MEMS device corresponding to the three sensitive axes. Test data can be correlated with other parameters of the MEMS devices as well.

Returning back to the algorithm shown in FIG. 21, after one or more MEMS devices has been tested, the test program in step 2128 checks if all of the MEMS devices have been tested according to the test program and chooses a next step from the possible steps: (1) returning back to the step of selecting a next group of devices containing of at least one MEMS device for testing, (2) moving further to the step 2130 of processing test data and generating output test results. The first option is chosen if not all MEMS devices specified by the test program are tested yet. The second option is chosen after the MEMS devices specified by the test program are tested.

Step 2130 of processing test data collected during testing of the MEMS devices and generating output test results in step 2130 according to the test specification and test program, which can include documentation, displayed information, graphics, etc. The test data processing can also comprise calculating parameters of each tested die, calculating statistical characteristics and distributions of these parameters for the tested wafer and wafer lot, comparing these results with the specification and providing a verdict regarding tested MEMS devices, tested wafer or wafer lot represented by the tested wafer or a group of wafers. Some individual test data of MEMS devices can be excluded from the analysis during data processing. For example, this can happen if some MEMS devices have out of range parameters, which can indicate a catastrophic failure due to a broken metal line, a non-functioning mechanical structure or other reason. Parameters of MEMS devices determined, as a result of testing, can include initial output signals or offsets or zero force signals of the sensitive components; sensitivity of tested MEMS devices to applied force, including sensitivity of each sensitive component to applied force; sensitivity of the MEMS device corresponding to each sensitive axis; sensitivity of tested MEMS device to different physical parameters (as pressure, force, acceleration, angular rate, etc.), and other parameters.

Test results obtained in step 2132 can include documentation, wafer maps showing accepted/rejected dice, distribution of measured and calculated parameters on the tested wafer as well as summary distributions for the whole wafer lot. In one embodiment rejected MEMS devices can be directly marked on the tested wafer using ink or other type of marking, for example, laser.

Second Test Embodiment

Figure 22A:
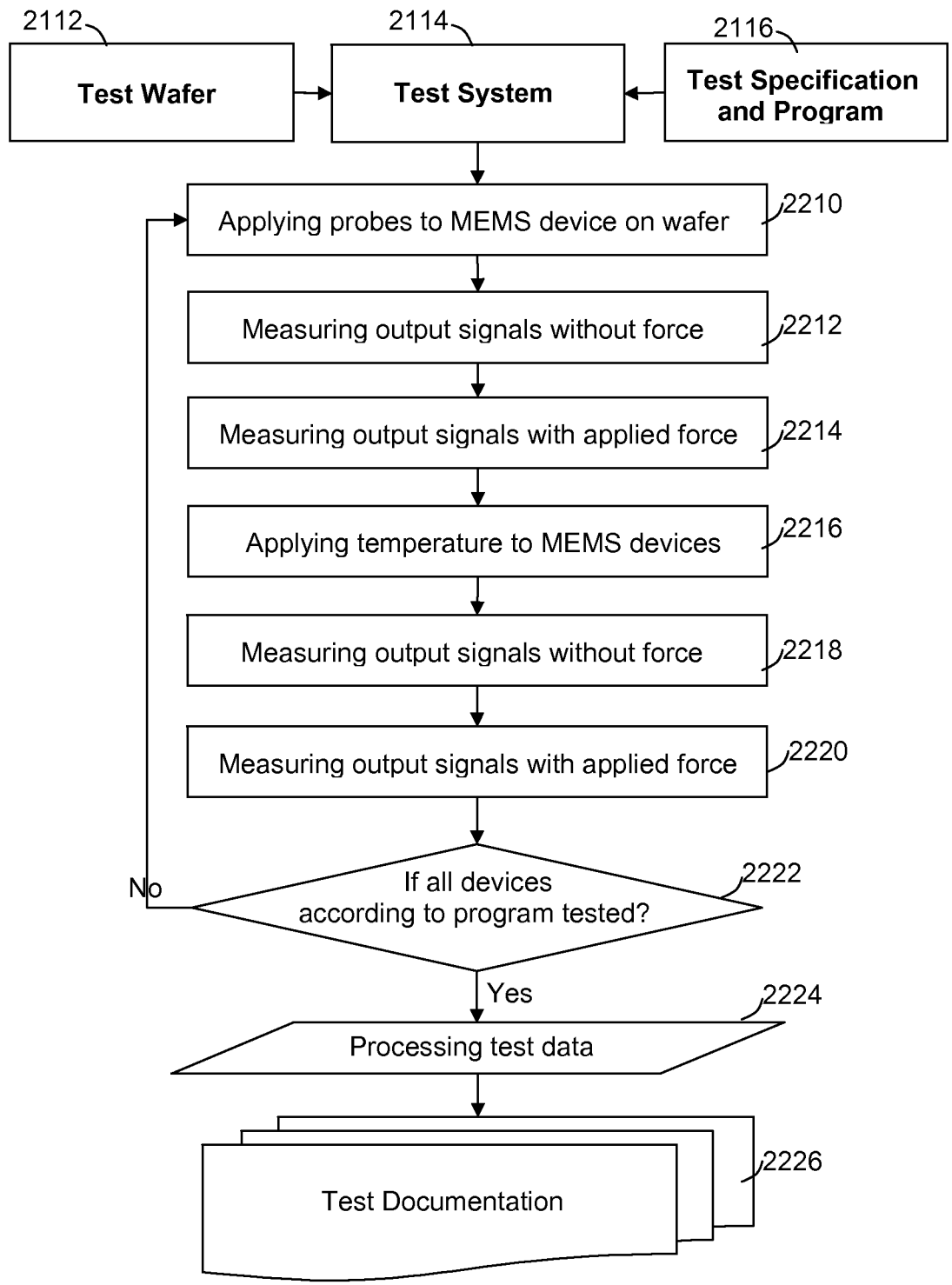
FIG. 22A illustrates an algorithm according to some embodiments of electromechanical testing of MEMS devices on a wafer at different temperatures.
Figure 22B:
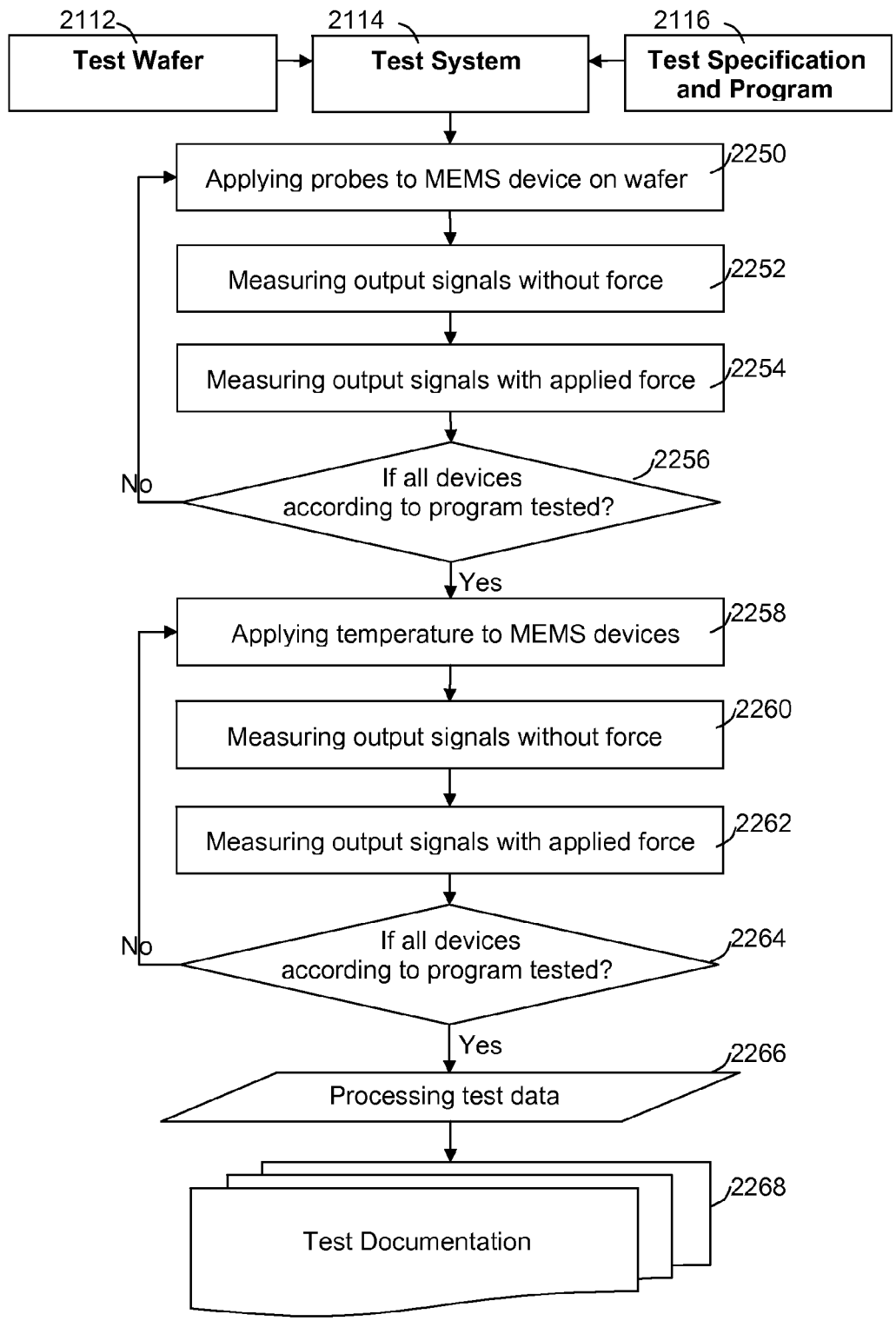
FIG. 22B illustrates an algorithm according to some embodiments of electromechanical testing of MEMS devices on a wafer at different temperatures.

FIGS. 22A and 22B illustrate methods of electromechanical testing of MEMS devices on the wafer level according to some embodiments. A substrate 2112, such as a wafer or multiple bonded together wafers, with MEMS devices for testing, a test system 2114 for electromechanical testing of these MEMS devices on the substrate level, a test program and a specification 2116 are provided initially.

A test system 2410, according to some embodiments, for electromechanical testing of MEMS devices on the wafer level is shown in FIG. 24 and has been described above in the first embodiment. In addition to the components described in the first embodiment the test system can include a temperature system that is configured to apply temperature to the testing MEMS wafer under test. The temperature can be applied using either local (die-level) heating or cooling or global (wafer-level) heating or cooling. Local heating or cooling can be achieved using laser, source of infrared radiation, source of ultraviolet radiation, heated or cooled mechanical object contacting the die or located near the die under test, flow of air, micro-nozzle with compressed air or other gas, and other such methods or combination of the above. Wafer-level heating or cooling can be achieved using heated chuck, source of infrared radiation, source of ultraviolet radiation, and other such methods or combination of the above. Other methods of heating or cooling a die, an area on the wafer or the whole wafer can be used.

Referring to FIG. 22A, the test routine starts with loading a MEMS wafer for testing on wafer holder or chuck. The next step 2210 is selecting a group of MEMS devices for testing according to the test program and applying electrical probes to this group of devices. The selected group consists of at least one MEMS device.

At the next steps 2212 power is provided to at least one MEMS device and a first set of output signals of the testing MEMS device are measured. Initial measurements can be made at room temperature or at other initial temperature specified by the test program. These signals typically represent output of tested MEMS device without applied force at an initial temperature.

At the next step 2214, as it is shown in FIG. 22A, a force is applied to at least one MEMS device under test using the actuator. Second set of output signals of the MEMS devices are measured with applied force. These measurements are typically also made at the initial temperature. Similarly to the first embodiment, the force can be applied to the testing MEMS devices under different test conditions. This approach is helpful in testing of multi-axis MEMS devices, which contain multiple sensitive components.

At the next step 2216 a temperature is applied to the one or more MEMS devices under test using one of the methods described above. A third set of output signals of the MEMS devices is measured without applied force in step 2218, and fourth set of output signals are measured with applied force in step 2220. Testing MEMS devices with and without applied force at a temperature other than initial temperature can be done using the same approaches as during testing at the initial temperature.

Although FIG. 22A shows testing at two temperatures, testing of MEMS devices can be done at more than two temperatures as well. Similarly, testing can be done at different forces, and/or at different forces relative to the different temperatures.

After a group of MEMS devices has been tested at desired temperatures, the test program checks in step 2222 to determine whether the desired MEMS devices have been tested according to the test program and chooses a next step from the possible steps: (1) returning back to the step of selecting a next group containing of at least one MEMS device for testing, (2) moving further to the step of processing test data and generating output test documentation. The first option is chosen if not all the desired MEMS devices specified by test program are tested yet. The second option is chosen after the MEMS devices specified by the test program are tested.

The next steps are: processing test data 2224 and generating output test results 2226 (e.g., documentation, graphics, displayed results, etc.) according to the test specification and test program. Besides parameters characterizing tested MEMS devices, wafer and wafer lot described in the first embodiment, parameters characterizing temperature dependence of initial output signals or offsets or zero force signals of the sensitive components; sensitivity to applied force, sensitivity corresponding to each sensitive axis; sensitivity to different physical parameters (as pressure, acceleration, angular rate, etc.), and temperature dependence other parameters can be determined during test data processing and included in output test results, reports and/or documentation.

FIG. 22B illustrates a test process flow with a different sequence of steps including applying temperature during testing. It starts in step 2250 with loading a MEMS substrate (e.g., wafer) 2112 for testing on wafer holder or chuck, selecting a group of MEMS devices for testing and applying electrical probes to this group of devices. At the next step 2252 power is provided to at least one MEMS device and output signals are measured. Initial measurements can be made at room temperature or at other initial temperature specified by the test program. These signals represent output of tested MEMS device without applied force at an initial temperature. After that, a force is applied to at least one MEMS device under test using the force actuator in step 2254 and output signals of the MEMS devices are measured with applied force. These measurements are also made at the initial temperature.

An optional data processing step can be included in the flow, not shown, after testing at initial temperature is completed. Including this step can allow detection of low-yield wafers and aborting further test. Data processing also can allow some adjustment of the test routine "on the fly"—this approach is discussed in more details in the third embodiment—and can be helpful in saving test time and decreasing cost of testing.

In contrast with the test process flow shown in FIG. 22A, MEMS devices to be tested are tested first at the initial temperature. Accordingly, in step 2256 it is determined if the MEMS intended to be tested are tested. After testing at the initial temperature is completed, the second test temperature is applied to the MEMS devices in step 2258. It can be done using one of the methods described above. A group of MEMS devices comprising one or more MEMS devices is tested after that at the second test temperature without applied force in step 2260 and with applied force in step 2262 using the same approaches as during testing at the initial temperature.

There are different approaches for selecting devices for testing at the second temperature. The same number of MEMS devices can be tested at the second temperature as was tested at the initial temperature. Alternatively, either smaller or larger number of MEMS devices can be tested at the second temperature. The same devices, as tested at initial temperature, can be tested at the second temperature. Alternatively, a new set of devices can be selected for testing or some already tested and some new devices can be selected.

Although FIG. 22B shows testing at two temperatures, testing of MEMS devices can be done at more than two temperatures as well. Similarly, testing at different forces and/or different combinations of forces and/or temperatures can be performed.

In some embodiments, temperature can be measured inside the MEMS, by at least one temperature sensor integrated on the MEMS wafer or other such methods. For example, one temperature sensor can be integrated within each of the MEMS devices. Using temperature sensors allows better control of this parameter and also can speed up the test as measurements can be made without waiting for temperature stabilization.

After all specified MEMS devices have been tested at the desired temperatures and/or forces (step 2264), the test software processes test data (step 2266) and generates output test results (step 2268) according to the test specification and test program.

Third Test Embodiment

Figure 23:
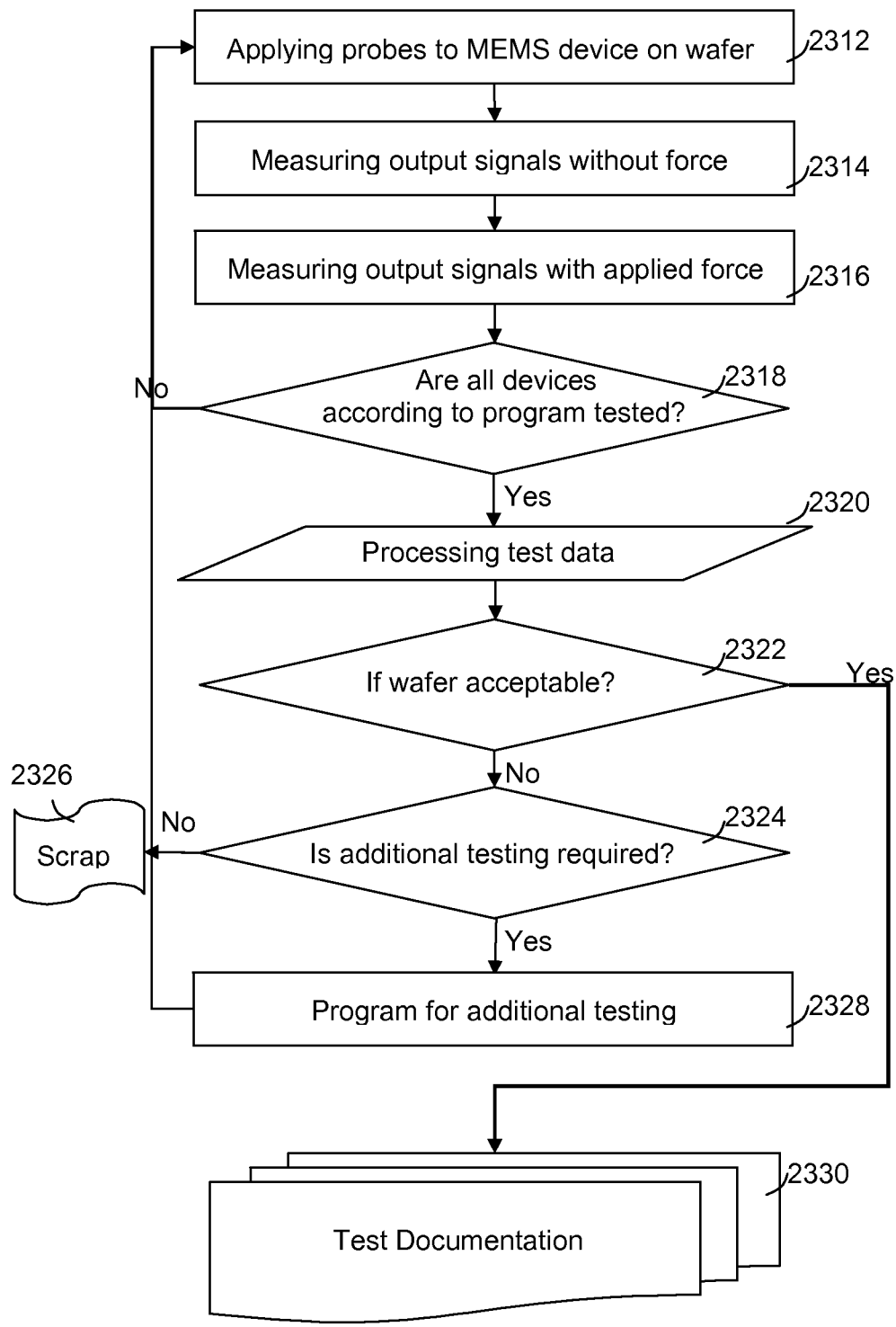
FIG. 23 illustrates an adaptive algorithm of electro-mechanical testing of MEMS devices on wafer according to some embodiments.

FIG. 23 illustrates method of electromechanical testing of MEMS devices on wafer level according to the third embodiment. Similarly to the previously described embodiments, although not shown in FIG. 23, a wafer with MEMS devices for testing, a test system for electro-mechanical testing of these MEMS devices on wafer level, a test program and a specification are provided initially.

Testing time per wafer is an important factor affecting both cost of testing and cost of product. This embodiment describes some options for decreasing testing time by using adaptive testing algorithms, which change testing routine based on the test data collected by testing MEMS devices on the wafer under test, statistical data for the lot the wafer belong to and statistical data for the product.

At the beginning of the test routine a MEMS wafer for testing is loaded on wafer holder or chuck. The next step 2312 is selecting a group of MEMS devices for testing according to the test program and applying electrical probes to this group of devices. The selected group consists of at least one MEMS device. In step 2314, a first set of output signals of the testing MEMS device are measured without applied force.

At the next step 2316 a force is applied to at least one MEMS device under test with help of the force actuator used in the test system. A second set of output signals of the MEMS devices are measured with applied force.

Different approaches that can be used to apply force to the MEMS device are discussed in the first embodiment. As it was discussed in the first embodiment, testing of multi-axis MEMS device having multiple sensitive components under several test conditions can be done to characterize sensitivity of this device corresponding to some or all of its sensitive axes.

In general, a MEMS device can be sensitive to one or several parameters, including some scalar and some vector parameters. Each scalar parameter can be associated with one sensitive axis and each vector parameter can be associated with one, two or three sensitive axes depending on number of components the MEMS device is sensitive to. For example, MEMS device can be sensitive to two components of force vector and such device can be considered as two-axis device. Similar device sensitive to all three components of force vector can be considered as three-axis device. Another device sensitive to all three components of acceleration vector and two components of angular rate vector is considered as a five axis device.

In case the MEMS devices are N-axis devices they have sensitive components generating at least N independent signals. The force can be applied to the same MEMS device under M test conditions, wherein M is greater or equal to N, in such a way that at least N sets of output signals corresponding to the M test conditions of applied force are linearly independent. This allows characterizing of the multi-axis MEMS device as N-axis MEMS device after processing test results. The test results can be considered as a system of M equations with N independent unknowns, i.e. sensitivities of the device corresponding to N axes, and this system can be solved with respect to N unknowns. It is possible that number of equations M is bigger than number N of unknowns. In this case the system of equations provides some additional information that can be used for different purposes including, in particular, evaluation of measurement errors, diagnostics of sensitive components, selecting the best subset of sensitive components for use in the MEMS device and other purposes resulting in increase of device accuracy, and reliability.

In order to save testing time and reduce cost of testing, in some cases it can be enough to apply force to an N-axis MEMS device under L test conditions where L is smaller than N. The set of test data collected as a result of that is not sufficient for calculating N sensitivities of the devices under test. However, it can be enough to verify that at least N sensitive components respond to the applied force with a signal of a magnitude corresponding to device specs. In the simplest case the device can be loaded using just one test condition and comparison of output signals of its sensitive components with and without applied force can be done. Such characterization can require less time than loading device using M test conditions (M≥N) as it is described above.

Testing 100% of MEMS devices can be used for some products. However, in high-volume manufacturing, process can be stable enough, well-characterized and well-controlled to guarantee yield very close to 100%. Therefore, 100% testing can be substituted with a sample testing, which results in decreasing of both testing time and cost of testing. Testing of only a group of devices in predetermined locations can be implemented, such that 1%, 5%, 20% or other percentage of devices on wafer is tested. Decision about accepting or rejecting the whole wafer can be made based on the test data available as a result of sample testing. Similarly, only few wafers from a wafer lot can be tested and decision about quality of other wafers can be made based on the test results of the tested wafers.

Returning back to the algorithm shown in FIG. 23, after a group of MEMS devices has been tested, the test program in step 2318 checks if the desired number of MEMS devices have been tested according to the test program and chooses a next step from the two possible steps: (1) returning back to the step of selecting a next group containing of at least one MEMS device for testing and (2) moving further to the step of processing test data. The first option is chosen if not all MEMS devices specified by test program are tested yet. The second option is chosen after all devices specified by the corresponding step of the test program are tested.

The processing of test data at step 2320 can comprise calculating specified parameters of each tested die, calculating specified statistical distributions of these parameters, comparing these results with the specification, providing a verdict regarding tested devices, comparing parameters of statistical distributions determined for the tested devices with data available from statistical process control and test data from other wafers from the same wafer lot.

After processing the test data, the test program makes a decision at step 2322 regarding accepting the test wafer. In case the wafer is accepted testing is finished and test results are generated in step 2330. If the wafer can not be accepted based on the available test results then the program makes a decision in step 2324 regarding additional testing: if available test data is enough to reject the wafer then the wafer scrapped in step 2326, as it is shown in FIG. 23. Otherwise, the test program in step 2328 determines how many additional MEMS devices should be tested and their location on the wafer. These additional MEMS devices are tested using similar test sequence as for the initial group of devices. In one embodiment at least some statistical parameters for the tested MEMS devices from the wafer are re-calculated after each additional tested device and testing can be stopped after the statistical parameters are falling within the specified limits.

In other embodiment, the test program processes test data and again makes a decision regarding accepting the test wafer acting as described in the previous paragraph only after the additional MEMS devices have been tested. The cycle can be repeated until wafer is either accepted or rejected. This approach allows a significant reduction of test time in comparison with 100% testing.

In order to reduce test time the test program can measure only some parameters after initial sampling is done: some parameters can have good distributions and do not require additional testing while some other parameters can require additional test data in order to confirm that statistical parameters of corresponding distributions are in spec. For example, if, as a result of the first group testing, offset voltages have wider distribution, than spec defined, while other parameters, for example sensitivities, are in spec, then in some instances only offsets in additional test group will be measured.

A related task that can be addressed by the test program is excluding some data from the analysis based on a hypothesis that they do not belong to the distribution. This situation can happen when one of the tested devices has a defect as a broken or shorted electrical line, broken or not released mechanical structure or other defect causing catastrophic failure. The test program can make a hypothesis regarding the root cause for some test data points and verify that by testing some additional MEMS devices. Excluding some test results from analysis "on the fly", i.e. during testing, also allows test time reduction and increase of tester productivity.

The final steps 2330 are processing test data and generating output test results according to the test specification and test program. These steps are described in the above embodiments.

Besides a periodic calibration of the measurement tools used in the test system, it is important to have some options to quickly verify functionality of the test system. This can be done by using test wafers with known electrical performance, by collecting data and analyzing statistics for test sites and test components from multiple wafers, by using some simple components with well-controlled parameters on MEMS wafers for verification of the test system performance. Monitoring, self-testing and performance verification techniques can save time and resources by early diagnostics of test system problems and fixing them without getting any bad test data. Implementing such methods together with some adaptive testing algorithms described above can decrease the test system idle/down time and further increase its productivity.

Fourth Test Embodiment

This embodiment provides more details related to interaction of the force actuator with microstructures formed within MEMS devices.

Figures 25A, 25B:
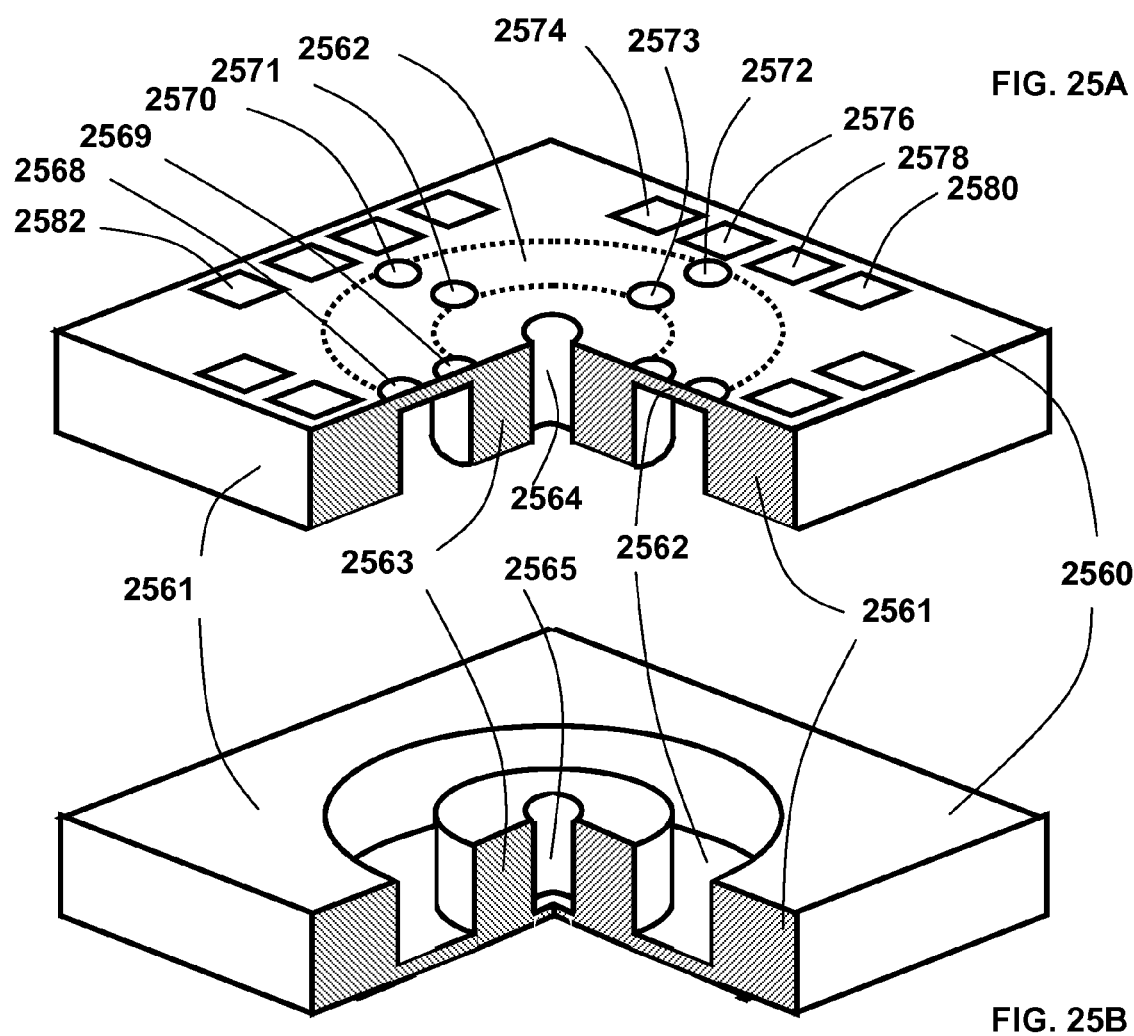
FIG. 25A illustrates a front or top, perspective view of an example of a multi-axis MEMS force sensor that can be tested on wafer according to some embodiments.
FIG. 25B illustrates a back side or bottom, perspective view of an example of the multi-axis MEMS force sensor that can be tested on wafer according to some embodiments.

FIGS. 25A and 25B show MEMS dice 2560. It should be understood that the shown MEMS dice are generic examples of dice having a microstructure. Although only one die is shown, it can be appreciated that this die is a part of MEMS wafer. The die 2560 has a frame 2561, an elastic element in the form of an annular diaphragm 2562 and a central boss 2563. The elastic element can have a different shape, as for example square or rectangular shape. The elastic element also can have openings. For example, elastic element can be represented by a set of beams. The boss has a through hole 2564 (see FIG. 25A). Another version with a boss 2563 having a cavity 2565 is shown in FIG. 25B. Sensitive components 2568, 2569, 2570, 2571, 2572, and 2573 are formed on the elastic element. Pads 2574, 2576, 2578, 2580 and 2582 are located on the frame 2561. Some of the pads can be used for wire bonding and some pads can be used for providing electrical contacts to the MEMS die during probing. Force applied to the elastic element causes its deformation and change of the output signal of at least some of the sensitive components 2568-2573.

Figure 26:
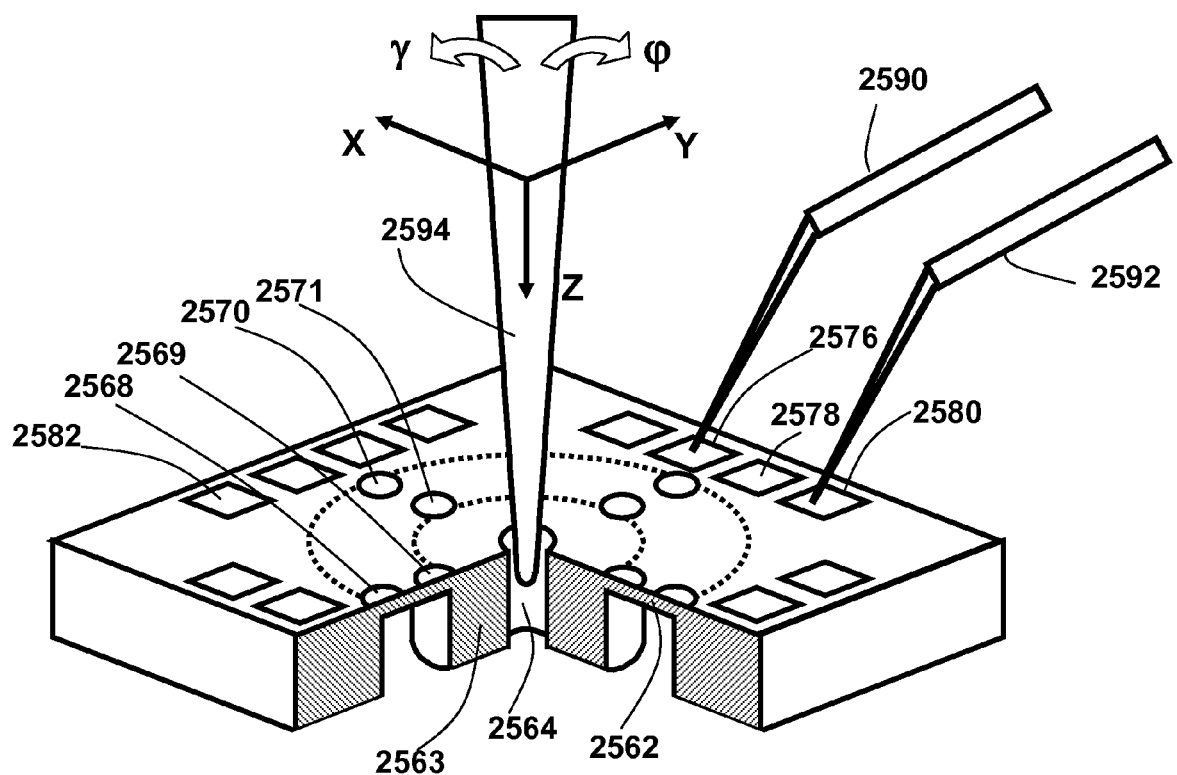
FIG. 26 illustrates a mutual position of a multi-axis MEMS force sensor and a pin-shaped part of a force actuator aligned for multi-axis testing from the front side of the wafer according to some embodiments.

FIG. 26 shows the same MEMS die of FIG. 25A during wafer-level testing. Probes 2590 and 2592 are in electrical contact with pads 2576 and 2580. Mechanical probe 2594 is a part of force actuator. The mechanical probe 2594 is brought in contact with the boss 2563, such as in some embodiments by inserting it into a cavity, recess, opening or hole 2564, which in some instances may be a through hole. The mechanical probe 2594 can have one of a variety of configuration, which can be dependent upon the intended force to be applied and/or the location where the force is to be applied on or proximate to the testing MEMS device. In the embodiment of FIG. 26, the needle-like shape of the mechanical probe 2594 helps both in inserting the mechanical probe into the opening 2564 and in self-alignment of the mechanical probe 2594 and the microstructure. Vertical (Z) force can be applied to the microstructure by moving the mechanical probe 2594 down in the Z direction as indicated in FIG. 26. Lateral force in X and/or Y directions can be applied, for example, by rotating the mechanical probe around Y and X axes correspondingly, as it is schematically shown in FIG. 26. Another option is in applying to the mechanical probe 2594 a translational force in lateral directions (in X-Y plane). This approach allows applying force of different magnitude in different directions and characterizing sensitivity of the MEMS device to different components of the force vector. In particular, when Z force is applied then sensitive components 2568 and 2570 respond similarly because of the microstructure symmetry. Sensitive components 2569 and 2571 also respond to the applied force also similarly. However, when force is applied in either X direction or Y direction then these pairs of sensitive elements respond differently. Plurality of output signals of the sensitive components measured without force and with force applied in X, Y and Z directions can be used to put together a system of equations with respect to initial output signal or offset or zero force signal and sensitivities of the MEMS device to X, Y and Z components of the force vector. Solving this system of equations can be used during the data processing step.

Figure 27:
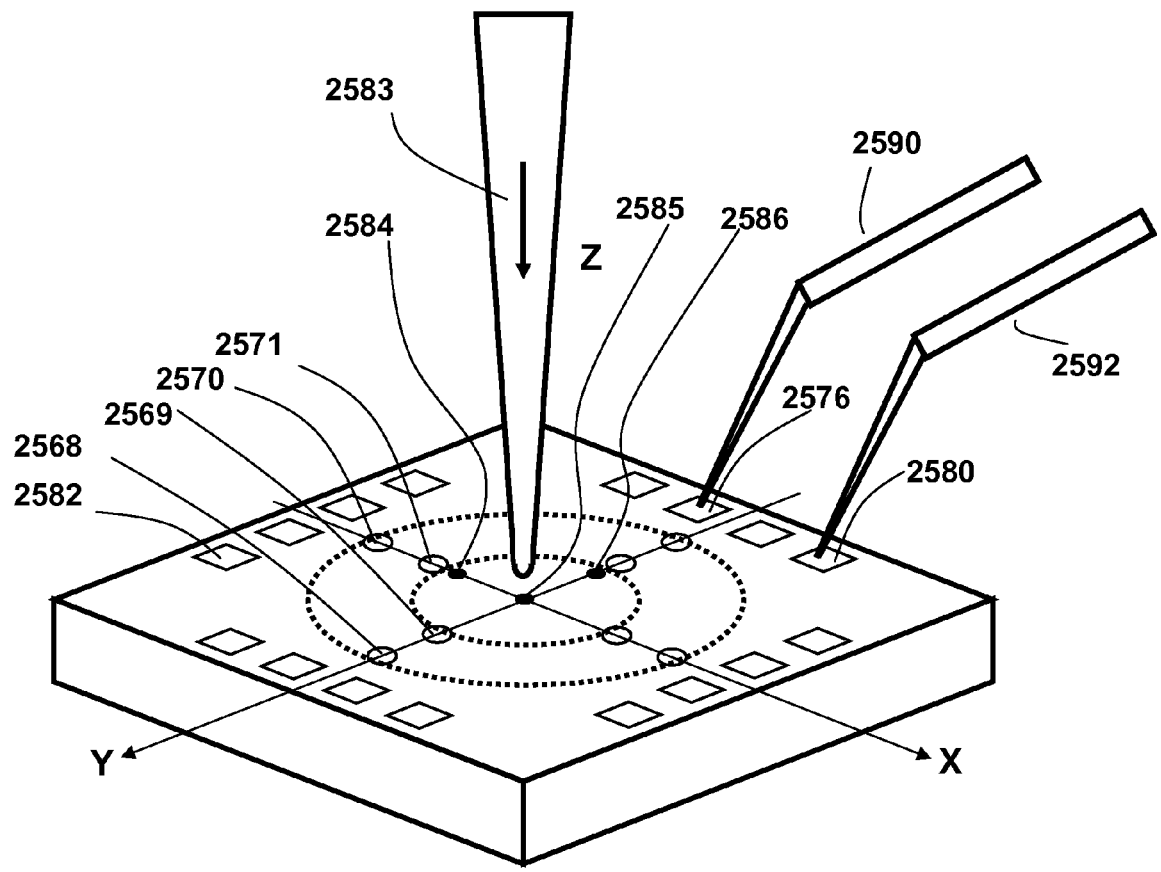
FIG. 27 illustrates a mutual position of a multi-axis MEMS force sensor and a part of force actuator aligned for loading of the MEMS structure by vertical (Z) force according to some embodiments.

An additional or alternative approach is related to applying force to different areas of the MEMS device under test. FIG. 27 shows a MEMS device similar to the one shown in FIG. 25B. The vertical (Z) force is applied in the areas 2584, 2585 and 2586 with help of mechanical probe 2594, as it is shown in FIG. 27. When force is applied at the center 2585 of the microstructure then sensitive components 2568 and 2570 respond similarly because of the microstructure symmetry. Sensitive components 2569 and 2571 also respond to the applied force also similarly. When the force is applied in the areas 2584 or 2586 then these pairs of sensitive elements respond to the applied force differently. Similarly to the case described above, the plurality of output signals of the sensitive components measured without force and with force applied (and/or at differing temperatures) in areas 2584, 2585 and 2586 can be used to put together a system of equations with respect to initial output signal or offset or zero force signal and sensitivities of the MEMS device to X, Y and Z components of the force vector. The system can be solved during the data processing step.

In a general case, a MEMS device can have at least one force-perceiving microstructure for mechanical interaction with the force actuator. The at least one force-perceiving microstructure is chosen from the group of microstructures consisting of: pin, post, ridge, rim, mesa, bump, trench, cavity, hole, opening, dimple and combination of the above. A part of force actuator can mate with the at least one force-perceiving microstructure during the test and this allows application of force to the testing MEMS device under different test conditions. Force of different magnitudes can be applied at different locations and/or in different directions. The force-perceiving microstructure can also allow self-alignment with a mating part of the force actuator. Similarly, varying temperatures and/or other variable factors can be taken into consideration in evaluating the MEMS devices of a substrate.

Fifth Test Embodiment

Testing of MEMS devices on the wafer can be done by applying force from the back side of the wafer, i.e. side opposite to the contact pads, as well.

Figure 28:
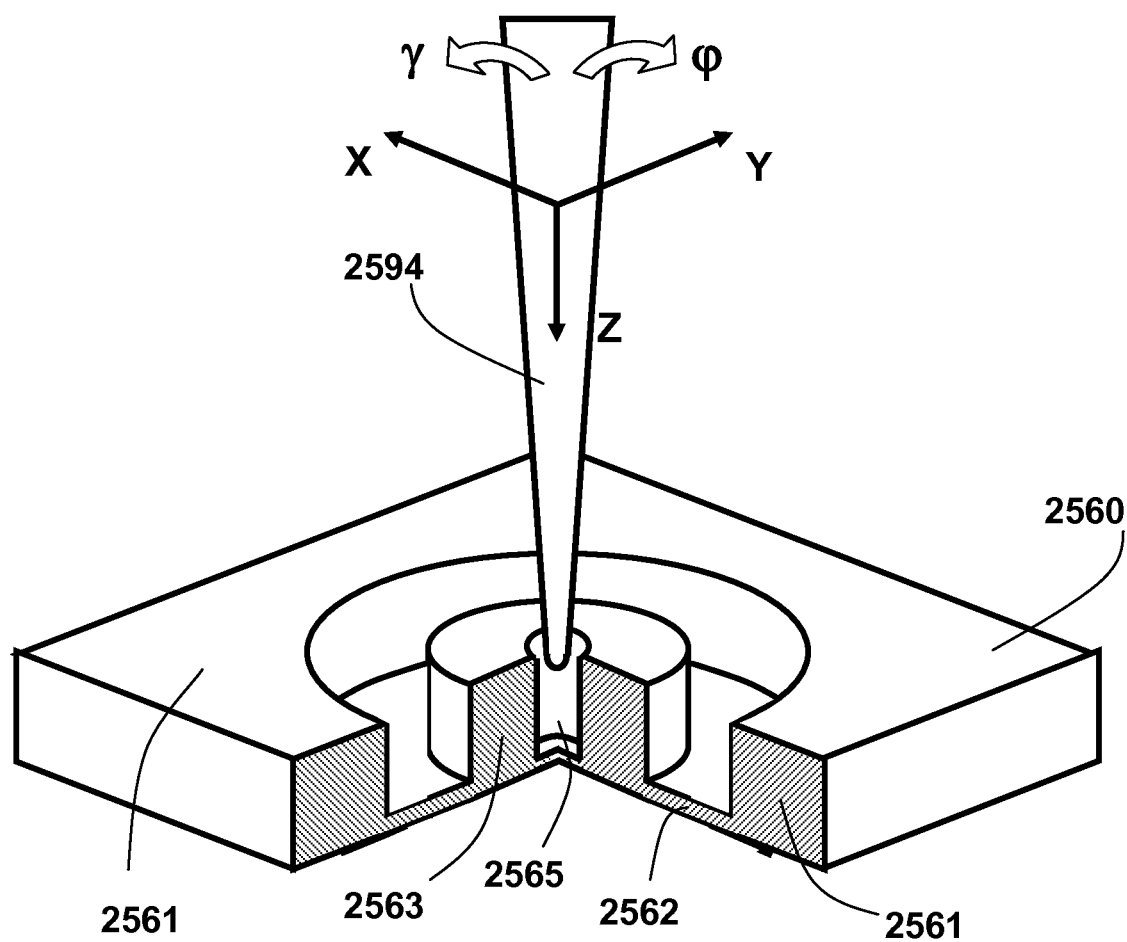
FIG. 28 illustrates a mutual position of a multi-axis MEMS force sensor and a pin-shaped part of force actuator aligned for multi-axis testing from the back (profiled) side of the wafer according to some embodiments.

FIG. 28 shows a portion of MEMS wafer 2560, similar to that in FIG. 25B, containing at least one MEMS die. The die has a frame 2561, an annular diaphragm 2562 and a boss 2563. The boss 2563 has a cavity 2565. The cavity can be used for self-aligning of a mechanical probe 2594 or other part of the force actuator with the MEMS microstructure.

Probes for providing electrical contacts to the wafer under test and a part of test actuator providing mechanical contact to MEMS microstructure can be located on a front side (device side) that is on the opposite sides of the MEMS wafer as depicted in FIG. 28. This is the difference with the approach described in the fourth embodiment.

The MEMS wafer 2560 can be placed on a chuck in such a way that microstructures 2563 with cavity 2565 are facing the chuck and contact pads are facing the probe card. In this case the mechanical probe 2594 shown in FIG. 28 can be applied to the MEMS microstructure from the chuck side. Alternatively, the MEMS wafer can be placed on the chuck in such a way that contact pads are facing the chuck. The microstructures 2563 with cavities 2565 are facing upward and the mechanical probe 94 of the force actuator is applied to the MEMS structures from the side opposite to the chuck.

Similarly to the microstructure loading options described in the fourth embodiment, vertical (Z) force can be applied to the microstructure 2562, 2563 by moving the mechanical probe 2594 (e.g., a pin) toward the boss 2563. Lateral force in X and Y directions can be applied, for example, by rotating the mechanical probe 2594 around Y or X axes correspondingly, as it is schematically shown in FIG. 28.

Figure 29:
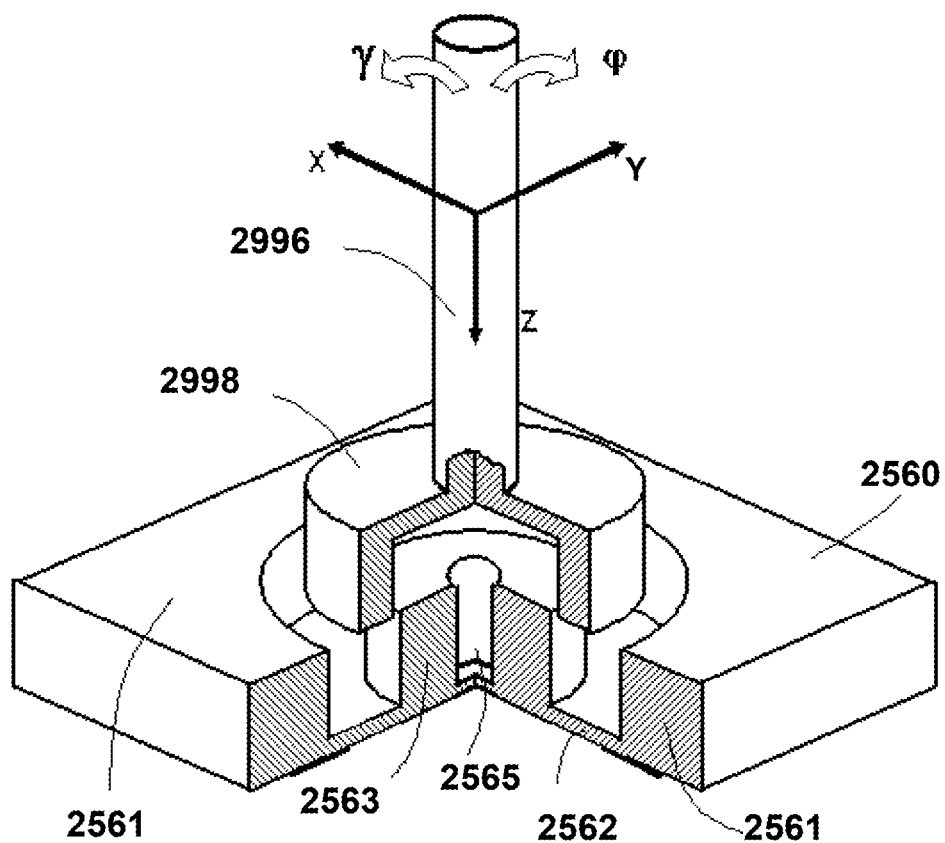
FIG. 29 illustrates a mutual position of a multi-axis MEMS force sensor and a fitting-shaped part of force actuator aligned for multi-axis testing from the back (profiled) side of the wafer according to some embodiments.

Other than needle-shaped mechanical probes can be used. FIG. 29 shows an alternative option for applying force to a MEMS device during wafer-level testing. FIG. 29 shows a portion of MEMS wafer 2560 containing at least one die having a frame 2561, an annular diaphragm 2562 and a boss 2563. An arm 2996 of the mechanical probe has a female fitting 2998 at the end. Shape and material of the fitting 2998 and shape of the boss 2563 are chosen to allow an easy alignment and fitting. During MEMS wafer testing the arm 2996 with fitting 2998 are aligned with the boss 2563 and brought into mechanical contact. Vertical force applied to the arm is translated to the MEMS microstructure also as vertical force. Loading of the arm 2996 with a lateral translational force or rotating the arm 2996 loads the MEMS microstructure with a lateral force in X-Y plane.

Some embodiments provide methods of electromechanical testing of MEMS devices on a wafer are disclosed. In some implementations, the method comprises steps of providing a wafer with MEMS devices for testing, a test system comprising electrical contacts to at least one MEMS device and at least some components of an actuator for applying force to at least one MEMS device; a test specification and a test program; selecting at least one MEMS device according to the test program and applying electrical probes to this device; providing power to at least one MEMS device through electrical probes; measuring output signals of the testing MEMS device; applying force to the testing MEMS device using force actuator; measuring a set of output signals of the testing MEMS device with applied force; checking if the MEMS devices have been tested according to the test program and choosing a next step from the two possible steps: (1) returning back to the step of selecting a next at least one MEMS device for testing and (2) moving further to the step of processing test data and generating output test documentation; processing test data and generating output test documentation according to the test specification and test program after the MEMS devices selected by the test program have been tested. The force is applied to the testing MEMS devices by a force actuator, which can be a mechanical actuator, a magnetic actuator, an electro-magnetic actuator, an electrostatic actuator, a thermal actuator, a piezoelectric actuator and pneumatic actuator.

The force actuator has some tangible components and, in some embodiments, force is applied to the MEMS device under test after relative motion of the MEMS device and at least one tangible component of the force actuator toward each other.

Other embodiments provide alternative methods of electro-mechanical testing (probing) of multi-axis MEMS devices on a wafer. These methods comprise steps of providing a wafer with MEMS devices for testing, a test system comprising electrical contacts to at least one MEMS device and at least some components of a force actuator for applying force to at least one MEMS device and a test specification and a test program; selecting at least one MEMS device according to the test program and applying electrical probes to this device; providing power to at least one MEMS device through electrical probes; measuring a set output signals of the testing MEMS device; applying force to the testing MEMS device under at least two test conditions using the force actuator; measuring output signals of the testing MEMS device corresponding to the at least two test conditions; checking if the MEMS devices have been tested according to the test program and choosing a next step from the two possible steps: (1) returning back to the step of selecting a next at least one MEMS device for testing and (2) moving further to the step of processing test data and generating output test documentation; processing test data and generating output test documentation according to the test specification and test program. The at least two test conditions correspond to one of the following sets of conditions: (1) a force applied in at least two different locations; (2) a force applied in at least two non-collinear directions. The sets of measured output signals corresponding to the at least two test conditions are linearly independent, which after processing results in characterization of multi-axis MEMS device as at least two-axis MEMS device.

Other embodiments describe test system for electro-mechanical testing (probing) of multi-axis force-sensitive MEMS devices on a wafer for implementing the above described wafer-level methods of testing of MEMS devices. The test system comprises X-Y-Z stage for automated positioning of a wafer with multi-axis force-sensitive MEMS devices for testing comprising a chuck for holding the wafer, a probe card with probes for making electrical contacts to at least one MEMS device, a force actuator for applying force to at least one multi-axis force-sensitive MEMS device, a data acquisition equipment for conditioning and converting electrical signals from MEMS devises into digital data, a processor and software for processing data from data acquisition equipment, control of the X-Y-Z stage, control of the force actuator, generating documentation and communicating with the production server or network. The force actuator provides different test conditions chosen from the group of: applying force in at least two different locations, applying force in at least two non-collinear directions and applying force of different magnitude or combination.

It should be understood that the components of the test systems, test programs, testing steps and their sequences, functionality of the MEMS devices, measurements made during testing, microstructures of the die, designs of the force actuator, methods of applying force and materials used do not limit the present invention, but only illustrate some of the various technical solutions covered by this invention. While the invention has been described in detail with reference to some embodiments, it is understood that variations and modifications thereof may be made without departing from the true spirit and scope of the invention.

What is claimed is:

1. A method of automated volume electromechanical testing of MEMS devices on a wafer level comprising steps of:
   providing a wafer with MEMS devices for testing;
   providing a test system comprising probes for electrical contacts to at least one testing MEMS device and a force actuator configured to apply force to at least some areas and at least in some directions to the at least one testing MEMS device;
   providing a test specification and a test program;
   selecting at least the testing MEMS device according to the test program and applying one or more electrical probes to the testing MEMS device;
   providing power to at least the testing MEMS device through the one or more electrical probes;
   measuring a first set of output signals of the testing MEMS device;
   applying force to the testing MEMS device under at least two different test conditions using the force actuator to apply forces, the at least two different test conditions are chosen from the group of: one or more forces applied in at least two different locations, and one or more forces applied in at least two non-collinear directions;
   measuring a second set of output signals of the testing MEMS device while the force under at least two different test conditions is applied;
   determining whether MEMS devices have been tested according to the test program, and choosing the next step, based on whether the MEMS devices have been tested according to the test program, from the group of steps comprising of:
      returning back to the group of steps starting with selecting at least one next MEMS device for testing; and
      moving further to the step of processing test data;
   processing the test data and generating output test results according to the test specification and test program;
   whereby at least the second set of output signals corresponding to at least the two different test conditions of applied force are linearly independent, which, after processing, results in characterization of multi-axis MEMS device as at least two-axis MEMS device.

2. A method of claim 1 wherein the force actuator used to apply force to the testing MEMS device is chosen from the group of actuators comprising: mechanical actuator, magnetic actuator, electromagnetic actuator, electrostatic actuator, thermal actuator, piezoelectric actuator and pneumatic actuator.

3. The method of claim 1 wherein the test program and test specification comprises: a wafer map; a number of dice to be tested and their position on the wafer map; conditions and sequence of testing and acceptable ranges of parameters.

4. The method of claim 1 further comprising the steps of:
   applying temperature to the testing MEMS device; and
   wherein the measuring the output signals comprises measuring the output signals of the testing MEMS device while the temperature is applied.

5. The method of claim 4, wherein the applying the temperature to the testing MEMS device comprises applying the temperature to the testing MEMS device by a method chosen from the group of: overall heating of at least the substrate, heating a platen of a chuck, local heating by a laser, local heating by an infrared radiation, local heating by ultraviolet radiation, local heating by a contact heater, local cooling by a flow of decompressed gas, local cooling by a flow of liquid gas, and combination thereof.

6. The method of claim 4, wherein the applied temperature is measured by a temperature sensor integrated within each testing MEMS device.

7. The method of claim 1, wherein the force is applied to at least the testing MEMS device after relative motion of at least the testing MEMS device and at least one tangible component of the force actuator toward each other.

8. The method of claim 1, wherein the force is applied to at least one testing MEMS device in a way chosen from the group of: applying force in at least two different locations of the testing MEMS device; applying at least two values of force to the same location of the testing MEMS device; applying the force to the testing MEMS device in at least two different directions, and combination of the above.

9. The method of claim 1, wherein relative motion of the testing MEMS device and the at least one tangible component of the force actuator toward each other happens during applying electrical probes to at least the testing MEMS device.

10. The method of claim 1, wherein the force is applied to the testing MEMS device by applying one of: contact force, non-contact force, electrostatic force, pneumatic force, magnetic force, pressure, vibration, shock and combination.

11. The method of claim 1, wherein a magnetic force is applied to the testing MEMS device using a method chosen from the group of: moving a source of magnetic field relative to the testing MEMS device having a component formed out of ferromagnetic material; moving a source of magnetic field relative to the testing MEMS device having a conductor carrying a current.

12. The method of claim 1, wherein the force is applied to the testing MEMS device under at least three test conditions and at least three sets of output signals corresponding to at least three test conditions of applied force are linearly independent, which, after processing, results in characterization of multi-axis MEMS device as at least three-axis MEMS device.

13. The method of claim 1, wherein the applying the force to the testing MEMS device comprises applying to the testing MEMS device under M test conditions and at least N (N≤M) sets of output signals corresponding to the M test conditions of applied force are linearly independent, which after processing results in characterization of multi-axis MEMS device as N-axis MEMS device.

14. The method of claim 1, wherein the testing MEMS device has at least one force-perceiving microstructure for mechanical interaction with the force actuator and the at least one force-perceiving microstructure is chosen from the group of microstructures comprising of: pin, post, ridge, rim, mesa, bump, beam, trench, cavity, hole, opening, dimple and combination of the above.

15. The method of claim 14, wherein a part of the force actuator mates with the at least one force-perceiving microstructure to achieve a purpose chosen from the group of: self-alignment of the at least one force-perceiving microstructure with the mating part of the force actuator, creating required test conditions for the testing MEMS device, and combination of the above.

\* \* \* \* \*